（12）United States Patent
Ko et al.

(10) Patent No.: US 12,426,446 B2
(45) Date of Patent: Sep. 23, 2025

(54) THIN FILM TRANSISTOR AND DISPLAY DEVICE COMPRISING THE SAME

(71) Applicant: LG Display Co., Ltd., Seoul (KR)

(72) Inventors: Younghyun Ko, Paju-si (KR); Jaeman Jang, Paju-si (KR); SeungChan Choi, Paju-si (KR); Min-Gu Kang, Paju-si (KR); Sungju Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 471 days.

(21) Appl. No.: 17/969,499

(22) Filed: Oct. 19, 2022

(65) Prior Publication Data

US 2023/0134901 A1 May 4, 2023

(30) Foreign Application Priority Data

Oct. 29, 2021 (KR) .................. 10-2021-0147157

(51) Int. Cl.
*H01L 27/32* (2006.01)
*H10K 59/121* (2023.01)
(Continued)

(52) U.S. Cl.
CPC ....... *H10K 59/1213* (2023.02); *H10K 59/126* (2023.02); *H10D 30/6723* (2025.01);
(Continued)

(58) Field of Classification Search
CPC ............. H10D 30/6729; H10D 30/673; H10D 30/6758; H10D 30/67; H10D 30/6713;
(Continued)

(56) References Cited

U.S. PATENT DOCUMENTS 8,309,964 B2    11/2012  Kim
9,147,719 B2 *   9/2015  Kim ................... H10D 86/60
(Continued)

FOREIGN PATENT DOCUMENTS

CN    111613664 A    9/2020
CN    112768497 A    5/2021
(Continued)

OTHER PUBLICATIONS

Korean Intellectual Property Office, Office Action, Korean Patent Application No. 10-2021-0147157, Nov. 13, 2024, seven pages, (with concise explanation of relevance).

(Continued)

*Primary Examiner* — Nikolay K Yushin
(74) *Attorney, Agent, or Firm* — Fenwick & West LLP

(57) ABSTRACT

A thin film transistor and a display device comprising the same is disclosed. The thin film transistor comprises an active layer on a substrate, and a first gate electrode at least partially overlapped with the active layer, wherein the active layer includes a channel portion, a first connection portion that is in contact with one side of the channel portion, and a second connection portion that is in contact with the other side of the channel portion, and an effective gate voltage applied to a first area of the channel portion, which is in contact with the first connection portion, is greater than that applied to a second area of the channel portion, which is in contact with the second connection portion.

11 Claims, 18 Drawing Sheets

(51) Int. Cl.
*H10K 59/126* (2023.01)
*H10D 30/67* (2025.01)
*H10D 86/40* (2025.01)
*H10D 86/60* (2025.01)

(52) U.S. Cl.
CPC ..... *H10D 30/6733* (2025.01); *H10D 30/6755* (2025.01); *H10D 86/423* (2025.01); *H10D 86/60* (2025.01)

(58) Field of Classification Search
CPC ........... H10D 30/6757; H10D 30/6723; H10D 30/6733; H10D 30/6755; H10D 86/423; H10D 86/60; H10D 86/40; H10D 86/421; H10K 59/126; H10K 59/1213; H10K 59/121
See application file for complete search history.

(56) References Cited

U.S. PATENT DOCUMENTS

| | | | |
|---|---|---|---|
| 10,032,934 B2 * | 7/2018 | Tokunaga | H01L 21/02505 |
| 10,084,031 B2 | 9/2018 | Park et al. | |
| 10,236,308 B2 | 3/2019 | Lee et al. | |
| 10,461,143 B2 * | 10/2019 | Park | H10D 30/6734 |
| 10,804,299 B2 | 10/2020 | Lee et al. | |
| 11,588,027 B2 | 2/2023 | Cho et al. | |
| 2004/0195568 A1 | 10/2004 | Okumura | |
| 2005/0205923 A1 | 9/2005 | Han et al. | |
| 2011/0095286 A1 | 4/2011 | Kim | |
| 2015/0123084 A1 * | 5/2015 | Kim | H10D 86/60 257/43 |
| 2017/0323978 A1 * | 11/2017 | Tokunaga | H10D 86/423 |
| 2018/0097053 A1 | 4/2018 | Park et al. | |
| 2018/0130827 A1 | 5/2018 | Lee et al. | |
| 2018/0366532 A1 * | 12/2018 | Park | H10K 59/1213 |
| 2019/0189647 A1 | 6/2019 | Lee et al. | |
| 2021/0193804 A1 | 6/2021 | Cho et al. | |
| 2022/0190170 A1 | 6/2022 | Lee et al. | |

FOREIGN PATENT DOCUMENTS

| | | |
|---|---|---|
| CN | 113327935 A | 8/2021 |
| KR | 10-2005-0093422 A | 9/2005 |
| KR | 10-1022141 B1 | 3/2011 |
| KR | 10-2018-0036818 A | 4/2018 |
| KR | 10-2018-0050478 A | 5/2018 |
| KR | 10-2021-0081623 A | 7/2021 |
| KR | 10-2022-0084837 A | 6/2022 |

OTHER PUBLICATIONS

European Patent Office, Examination Report, European Patent Application No. 22198112.9, Dec. 9, 2024, five pages.

European Patent Office, Extended European Search Report and Opinion, EP Patent Application No. 22198112.9, Mar. 24, 2023, eight pages.

* cited by examiner

THIN FILM TRANSISTOR AND DISPLAY DEVICE COMPRISING THE SAME

CROSS-REFERENCE TO RELATED APPLICATION

This application claims the benefit of priority of the Republic of Korea Patent Application No. 10-2021-0147157 filed on Oct. 29, 2021, which is hereby incorporated by reference in its entirety.

BACKGROUND

Field

The present disclosure relates to a thin film transistor and a display device comprising the same.

Discussion of the Related Art

Transistors are widely used as switching devices or driving devices in the field of electronic devices. In particular, since a thin film transistor can be fabricated on a glass substrate or a plastic substrate, the thin film transistor is widely used as a switching device of a display device such as a liquid crystal display device or an organic light emitting device.

The display device may include, for example, a switching thin film transistor and a driving thin film transistor. It is favorable that the switching thin film transistor has a small s-factor to improve on-off characteristics and the driving thin film transistor has a large s-factor to represent a gray scale.

The thin film transistors generally have a small s-factor to make sure of on-off characteristics. Therefore, when these thin film transistors are applied to the driving thin film transistor of the display device, it is difficult to represent a gray scale of the display device.

Therefore, thin film transistors having a large s-factor are required to easily represent a gray scale by being used for the driving thin film transistor of the display device. Also, even though the thin film transistor has a large s-factor, it is required that the thin film transistor should have excellent current characteristics in an ON-state.

SUMMARY

The present disclosure has been made in view of the above problems and it is an object of the present disclosure to provide a thin film transistor that has a large s-factor and has excellent current characteristics in an ON-state.

It is another object of the present disclosure to provide a thin film transistor that has a large s-factor and has a large current value in an ON-state.

It is still another object of the present disclosure to provide a thin film transistor having a relatively large s-factor as an effective gate voltage at one side of a channel portion is lower than an effective gate voltage at the other side thereof, and having excellent ON-current characteristics as an interval between a gate electrode and an active layer is not great.

It is further still another object of the present disclosure to provide a thin film transistor having a large s-factor and at the same time having excellent ON-current characteristics by disposing a conductive material layer or an auxiliary gate electrode at one side of a channel portion.

It is further still another object of the present disclosure to provide a display device that has an excellent gray scale representation capability and excellent current characteristics by including a driving thin film transistor having a large s-factor and at the same time having large ON-current characteristics.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a thin film transistor comprising an active layer on a substrate, and a first gate electrode at least partially overlapped with the active layer, wherein the active layer includes a channel portion, a first connection portion that is in contact with a side of the channel portion, and a second connection portion that is in contact with the other side of the channel portion, wherein the thin film transistor is configured such that an effective gate voltage applied to a first area of the channel portion, which is in contact with the first connection portion, is greater than an effective gate voltage applied to a second area of the channel portion, which is in contact with the second connection portion.

The thin film transistor may further comprise a first conductive material layer between the substrate and the active layer, wherein the first conductive material layer may overlap the second area of the channel portion without overlapping the first area of the channel portion, and the first conductive material layer may be connected to the second connection portion.

The first conductive material layer may comprise a material having light shielding characteristics.

The thin film transistor may further comprise a second gate electrode between the first gate electrode and the active layer, wherein the second gate electrode may overlap the first area of the channel portion.

The second gate electrode may not overlap the second area of the channel portion.

At least a portion of the second gate electrode may overlap the first gate electrode, and at least a portion of the second gate electrode may not overlap the first gate electrode.

The thin film transistor may be configured so that the same voltage may be applied to the first gate electrode and the second gate electrode.

The thin film transistor may further comprise a second gate electrode between the first gate electrode and the active layer, wherein the second gate electrode may overlap the first area of the channel portion, and may not overlap the second area of the channel portion.

The thin film transistor may further comprise a first conductive material layer between the substrate and the active layer, wherein the first conductive material layer may overlap the second area of the channel portion without overlapping the first area of the channel portion, and the first conductive material layer may be connected to the second connection portion.

The thin film transistor may further comprise a second conductive material layer between the substrate and the active layer, wherein the second conductive material layer may overlap the first area of the channel portion and may not overlap the second area of the channel portion, and the thin film transistor is configured such that the same voltage as that of the first gate electrode may be applied to the second conductive material layer.

The first gate electrode may have a step profile, and a distance between the first gate electrode and the first area may be smaller than that between the first gate electrode and the second area.

The thin film transistor may further comprise a gate insulating layer between the first gate electrode and the active layer, wherein the gate insulating layer may have a step profile, and a thickness of the gate insulating layer on the first area may be smaller than that of the gate insulating layer on the second area.

The thin film transistor may further comprise a third conductive material layer between the substrate and the active layer, and a buffer layer between the third conductive material layer and the active layer, wherein the buffer layer may have a step profile, and a thickness of the buffer layer overlapped with the first area may be smaller than a thickness of the buffer layer overlapped with the second area.

The third conductive material layer may be connected to the first gate electrode.

The channel portion of the active layer may have a step profile.

The thin film transistor may further comprise a third conductive material layer between the substrate and the active layer, and a buffer layer between the third conductive material layer and the active layer, wherein the buffer layer may have a step profile, a thickness of the buffer layer overlapped with the first area may be smaller than that of the buffer layer overlapped with the second area, and the third conductive material layer may be connected to the first gate electrode.

The channel portion of the active layer may have a step profile, and the first gate electrode may have a step profile.

The active layer may include an oxide semiconductor material.

The oxide semiconductor material may include at least one of an IZO(InZnO)-based, IGO(InGaO)-based, ITO(InSnO)-based, IGZO(InGaZnO)-based, IGZTO(InGaZnSnO)-based, GZTO(GaZnSnO)-based, GZO(GaZnO)-based, ITZO(InSnZnO)-based or FIZO(FeInZnO)-based oxide semiconductor material.

The active layer may include a first oxide semiconductor layer, and a second oxide semiconductor layer on the first oxide semiconductor layer.

The active layer may further include a third oxide semiconductor layer on the second oxide semiconductor layer.

In accordance with another aspect of the present disclosure, the above and other objects can be accomplished by the provision of a display device comprising the above-described thin film transistor.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1A:
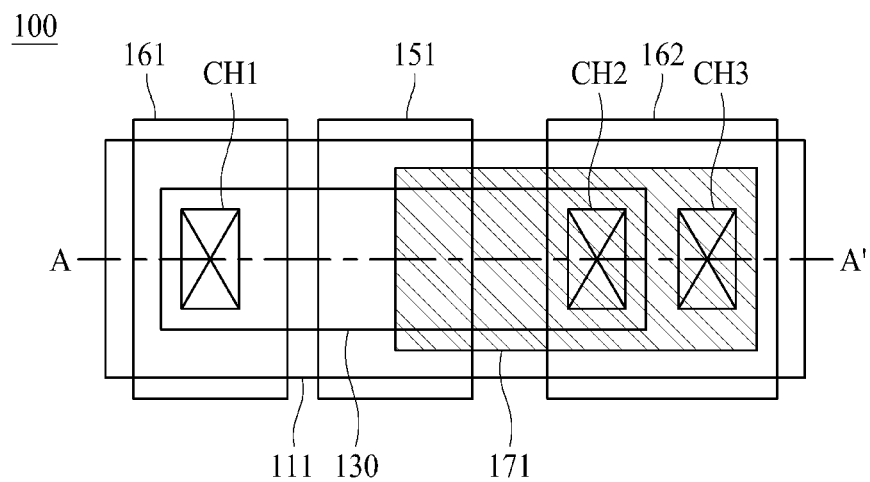
FIG. 1A is a plan view illustrating a thin film transistor according to one embodiment of the present disclosure.

Advantages and features of the present disclosure, and implementation methods thereof will be clarified through following embodiments described with reference to the accompanying drawings. These embodiments are provided so that this disclosure will be thorough and complete, and will fully convey the scope of the present disclosure to those skilled in the art. Further, the present disclosure is only defined by the scope of the claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above', 'below~', and 'next to~', one or more portions may be arranged between two other portions unless 'just' or 'direct' is used.

Spatially relative terms such as "below", "beneath", "lower", "above", and "upper" may be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below", or "beneath" another device may be arranged "above" another device. Therefore, an exemplary term "below or beneath" may include "below or beneath" and "above" orientations. Likewise, an exemplary term "above" or "on" may include "above" and "below or beneath" orientations.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present invention.

The term "at least one" should be understood as including any and all combinations of one or more of the associated listed items. For example, the meaning of "at least one of a first item, a second item, and a third item" denotes the combination of all items proposed from one or more of the first item, the second item, and the third item as well as one or more the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Thin film transistors and display devices comprising the same according to the embodiments of the present disclosure are described in detail with reference drawings. In the drawings, the same or similar elements are denoted by the same reference numerals even though they are depicted in different drawings.

In the embodiments of the present disclosure, a source electrode and a drain electrode are distinguished from each other, for convenience of description. However, the source electrode and the drain electrode may be used interchangeably. The source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In some embodiments of the present disclosure, for convenience of description, a source region is distinguished from a source electrode, and a drain region is distinguished from a drain electrode. However, the embodiments of the present disclosure are not limited to this structure. For example, a source region may be a source electrode, and a drain region may be a drain electrode. Also, a source region may be a drain electrode, and a drain region may be a source electrode.

Figure 1B:
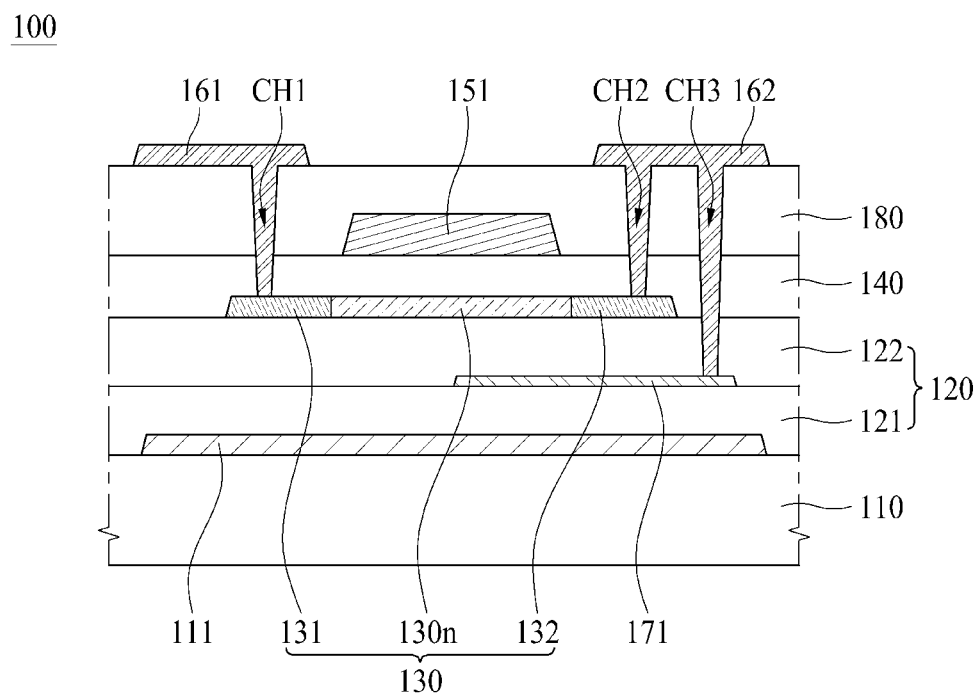
FIGS. 1B, 1C, 1D, and 1E are cross-sectional views illustrating a thin film transistor according to one embodiment of the present disclosure.

FIG. 1A is a plan view illustrating a thin film transistor according to one embodiment of the present disclosure, and FIGS. 1B, 1C, 1D and 1E are cross-sectional views illustrating a thin film transistor according to one embodiment of the present disclosure. In detail, FIG. 1B is a cross-sectional view taken along line A-A' of FIG. 1A.

The thin film transistor 100 according to one embodiment of the present disclosure includes an active layer 130 on a substrate 110 and a first gate electrode 151 at least partially overlapped with the active layer 130. The active layer 130 includes a channel portion 130n, a first connection portion 131 that is in contact with a first side of the channel portion 130n and a second connection portion 132 that is in contact with a second side of the channel portion 130n. According to one embodiment of the present disclosure, an effective gate voltage applied to a first area of the channel portion 130n, which is in contact with the first connection portion 131, is greater than an effective gate voltage applied to a second area of the channel portion 130n, which is in contact with the second connection portion 132.

According to one embodiment of the present disclosure, the thin film transistor 100 further includes a first conductive material layer 171 between the substrate 110 and the active layer 130. The first conductive material layer 171 overlaps the second area of the channel portion 130n without overlapping the first area of the channel portion 130n. The first conductive material layer 171 may be connected to the second connection portion 132.

Hereinafter, the thin film transistor 100 according to one embodiment of the present disclosure will be described in more detail with reference to FIGS. 1A and 1B.

Glass or plastic may be used as the substrate 110. A transparent plastic having a flexible property, for example, polyimide may be used as the plastic. When polyimide is used as the substrate 110, a heat-resistant polyimide capable of enduring a high temperature may be used considering that a high temperature deposition process is performed on the substrate 110.

A light shielding layer 111 may be disposed on the substrate 110. The light shielding layer 111 overlaps the channel portion 130n. The light shielding layer 111 shields light incident from the outside to protect the channel portion 130n.

The light shielding layer 111 may be made of a material having light shielding characteristics. The light shielding layer 111 may include at least one of an aluminum-based metal such as aluminum (Al) or an aluminum alloy, a molybdenum-based metal such as molybdenum (Mo) or a molybdenum alloy, chromium (Cr), tantalum (Ta), neodymium (Nd), titanium (Ti), or iron (Fe). According to one embodiment of the present disclosure, the light shielding layer 111 may have electrical conductivity.

The light shielding layer 111 may be omitted. Although not shown in FIG. 1B, a lower buffer layer 220 may be disposed between the substrate 110 and the light shielding layer 111 (see FIGS. 14 and 16). Although not shown, the light shielding layer 111 may be electrically connected to any one of a drain electrode 161 and a source electrode 162. The light shielding layer 111 may be electrically connected to the first gate electrode 151.

A first buffer layer 121 is disposed on the light shielding layer 111. The first buffer layer 121 may include at least one of a silicon oxide, a silicon nitride or a metal-based oxide. According to one embodiment of the present disclosure, the first buffer layer 121 may include at least one of a silicon oxide or a silicon nitride. The first buffer layer 121 may have a single layered structure, or may have a multi-layered structure.

The first buffer layer 121 protects the active layer 130. Also, an upper surface of the substrate 110 on which the light shielding layer 111 is disposed may be uniform by the first buffer layer 121.

The first conductive material layer 171 is disposed on the first buffer layer 121.

According to one embodiment of the present disclosure, the first conductive material layer 171 may have electrical conductivity. The first conductive material layer 171 may include at least one of an aluminum-based metal such as aluminum (Al) or an aluminum alloy, a molybdenum-based metal such as molybdenum (Mo) or a molybdenum alloy, chromium (Cr), tantalum (Ta), neodymium (Nd), titanium (Ti), or iron (Fe). The first conductive material layer 171 may have a multi-layered structure that includes at least two conductive layers having different physical properties.

In addition, the first conductive material layer 171 may comprise a material having light shielding characteristics. Therefore, the first conductive material layer 171 may serve as a light shielding layer. The first conductive material layer 171 may shield light incident on the substrate 110 to protect the channel portion 130*n*.

The first conductive material layer 171 is disposed between the substrate 110 and the active layer 130, and overlaps a portion of the channel portion 130*n* of the active layer 130. The electrical characteristics of the first conductive material layer 171 will be described later.

A second buffer layer 122 is disposed on the first conductive material layer 171. The second buffer layer 122 may include at least one of insulating materials selected from a silicon oxide, a silicon nitride and a metal-based oxide. According to one embodiment of the present disclosure, the second buffer layer 122 may include at least one of a silicon oxide or a silicon nitride. The second buffer layer 122 may have a single layered structure, or may have a multi-layered structure.

The second buffer layer 122 protects the active layer 130. In addition, the upper surface of the substrate 110 may be uniform by the second buffer layer 122. The second buffer layer 122 is formed such that the first conductive material layer 171 and the channel portion 130*n* are spaced apart and insulated from each other.

According to one embodiment of the present disclosure, the first buffer layer 121 and the second buffer layer 122 are collectively referred to as the buffer layer 120, but one embodiment of the present disclosure is not limited thereto, and each of the first buffer layer 121 and the second buffer layer 122 may be referred to as the buffer layer. According to one embodiment of the present disclosure, each insulating layer disposed between the substrate 110 and the active layer 130 may be referred to as the buffer layer.

The active layer 130 is disposed on the second buffer layer 122.

The active layer 130 may be formed by a semiconductor material. The active layer 130 may include any one of an amorphous silicon semiconductor material, a polycrystalline silicon semiconductor material and an oxide semiconductor.

According to one embodiment of the present disclosure, the active layer 130 may include an oxide semiconductor material. The oxide semiconductor material may include at least one of, for example, an IZO(InZnO)-based, IGO(InGaO)-based, ITO(InSnO)-based, IGZO(InGaZnO)-based, IGZTO(InGaZnSnO)-based, GZTO(GaZnSnO)-based, GZO(GaZnO)-based, ITZO(InSnZnO)-based, or FIZO(FeInZnO)-based oxide semiconductor material, but one embodiment of the present disclosure is not limited thereto, and the active layer 130 may be made of another oxide semiconductor material known in the art.

The active layer 130 may include a channel portion 130*n*, a first connection portion 131 and a second connection portion 132. The channel portion 130*n* overlaps the first gate electrode 151.

A portion of the channel portion 130*n* does not overlap the first conductive material layer 171, and another portion of the channel portion 130*n* overlaps the first conductive material layer 171. According to one embodiment of the present disclosure, an area of the channel portion 130*n*, which does not overlap the first conductive material layer 171, may be referred to as the first area, and an area of the channel portion 130*n*, which overlaps the first conductive material layer 171, may be referred to as the second area.

According to one embodiment of the present disclosure, the first area of the channel portion 130*n* is in contact with the first connection portion 131, and the second area of the channel portion 130*n* is in contact with the second connection portion 132.

The first connection portion 131 and the second connection portion 132 of the active layer 130 may be designed so as not to overlap the first gate electrode 151. The first connection portion 131 and the second connection portion 132 may be formed by selective conductorization of the semiconductor material. Providing conductivity to a selected part of active layer 130 is referred to as a selective conductorization. Selective conductorization can be performed by doping, plasma treatment, or the like.

According to one embodiment of the present disclosure, the first connection portion 131 of the active layer 130 may be a drain area, and the second connection portion 132 may be a source area. According to one embodiment of the present disclosure, the first connection portion 131 may be referred to as a drain electrode, and the second connection portion 132 may be referred to as a source electrode.

However, one embodiment of the present disclosure is not limited to the above example, the first connection portion 131 may be a source area, and the second connection portion 132 may be a drain area. Also, the first connection portion 131 may be referred to as a source electrode, and the second connection portion 132 may be referred to as a drain electrode.

A gate insulating layer 140 is disposed on the active layer 130. The gate insulating layer 140 may include at least one of a silicon oxide, a silicon nitride or a metal-based oxide. The gate insulating layer 140 may have a single layered structure, or may have a multi-layered structure.

Referring to FIG. 1B, the gate insulating layer 140 is not patterned, and may be integrally formed on the entire surface of the substrate 110, but one embodiment of the present disclosure is not limited thereto, and the gate insulating layer

140 may be patterned. For example, the gate insulating layer 140 may be patterned in a shape corresponding to the first gate electrode 151.

The gate insulating layer 140 protects the channel portion 130*n*.

The first gate electrode 151 is disposed on the gate insulating layer 140. The first gate electrode 151 overlaps the channel portion 130*n* of the active layer 130.

The first gate electrode 151 may include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd), or titanium (Ti). The first gate electrode 151 may have a multi-layered structure that includes at least two conductive layers having their respective physical properties different from each other.

An interlayer insulating layer 180 is disposed on the first gate electrode 151. The interlayer insulating layer 180 is an insulating layer made of an insulating material. The interlayer insulating layer 180 may be made of an organic material, may be made of an inorganic material, or may be made of a stacked body of an organic layer and an inorganic layer.

The drain electrode 161 and the source electrode 162 are disposed on the interlayer insulating layer 180.

The drain electrode 161 is connected to the active layer 130 through a contact hole CH1. In detail, the drain electrode 161 may be electrically connected to the first connection portion 131 of the active layer 130 through the contact hole CH1.

The source electrode 162 is spaced apart from the drain electrode 161 and connected to the active layer 130 through a contact hole CH2. In detail, the source electrode 162 may be electrically connected to the second connection portion 132 of the active layer 130 through the contact hole CH2. The source electrode 162 is connected to the first conductive material layer 171 through another contact hole CH3. As a result, the first conductive material layer 171 may be connected to the second connection portion 132 of the active layer 130.

Each of the drain electrode 161 and the source electrode 162 may include at least one of molybdenum (Mo), aluminum (Al), chromium (Cr), gold (Au), titanium (Ti), nickel (Ni), neodymium (Nd), copper (Cu) or their alloy. Each of the drain electrode 161 and the source electrode 162 may be made of a single layer made of a metal or a metal alloy, or may be formed of a multi-layer of two or more layers.

Referring to FIGS. 1A and 1B, the first connection portion 131 and the drain electrode 161 are shown to be distinguished from each other, but one embodiment of the present disclosure is not limited thereto. The first connection portion 131 may be a drain electrode, and an electrode represented by the reference numeral "161" may be a connection electrode or a bridge.

Referring to FIGS. 1A and 1B, the second connection portion 132 and the source electrode 162 are shown to be distinguished from each other, but one embodiment of the present disclosure is not limited thereto. The second connection portion 131 may be a source electrode, and an electrode represented by the reference numeral "162" may be a connection electrode or a bridge.

According to one embodiment of the present disclosure, the first conductive material layer 171 having electrical conductivity is disposed between the substrate 110 and the active layer 130. In detail, the first conductive material layer 171 may be designed to overlap a portion of the channel portion 130*n* but not to overlap another portion of the channel portion 130*n*.

According to one embodiment of the present disclosure, an area of the channel portion 130*n*, which does not overlap the first conductive material layer 171, may be referred to as the first area, and an area of the channel portion 130*n*, which overlaps the first conductive material layer 171, may be referred to as the second area. Therefore, the first conductive material layer 171 may not overlap the first area of the channel portion 130*n*, and may overlap the second area of the channel portion 130*n*.

According to one embodiment of the present disclosure, the first area of the channel portion 130*n* is in contact with the first connection portion 131, and the second area of the channel portion 130*n* is in contact with the second connection portion 132. Also, the first conductive material layer 171 is connected to the source electrode 162. As a result, the same voltage may be applied to the first conductive material layer 171, the second connection portion 132 and the source electrode 162.

The voltage applied to the first conductive material layer 171 affects a portion of the channel portions 130*n*. The voltage applied to the first conductive material layer 171 may affect the second area that is the area of the channel portion 130*n*, which overlaps the first conductive material layer 171.

For example, due to an electrical influence by the first conductive material layer 171, an electric field effect applied to the channel portion 130*n* by the first gate electrode 151 may be reduced. In detail, the electric field is applied to the channel portion 130*n* by the first gate electrode 151, and the electric field effect applied to the second area of the channel portion 130*n* may be reduced due to the electrical influence by the first conductive material layer 171.

Therefore, according to one embodiment of the present disclosure, an effective gate voltage Veff applied to the first area of the channel portion 130*n*, which is in contact with the first connection portion 131, may be greater than that applied to the second area of the channel portion 130*n*, which is in contact with the second connection portion 132. According to one embodiment of the present disclosure, the effective gate voltage Veff applied to the second area of the channel portion 130*n* may be smaller than that applied to the first area of the channel portion 130*n*.

As a result, an s-factor of the thin film transistor 100 may be increased.

Hereinafter, the s-factor will be described in detail.

In a drain-source current graph for a gate voltage of the thin film transistor 100, the s-factor (sub-threshold swing) is obtained by an inverse gradient (the reciprocal) of a slope of the graph for a threshold voltage Vth. For example, for the threshold voltage Vth of the thin film transistor 100, the s-factor may be used as an index indicating a rate of change of the drain-source current with respect to the gate voltage.

When the s-factor becomes large, a rate of change of a drain-source current IDS with respect to the gate voltage becomes slow.

Figure 7:
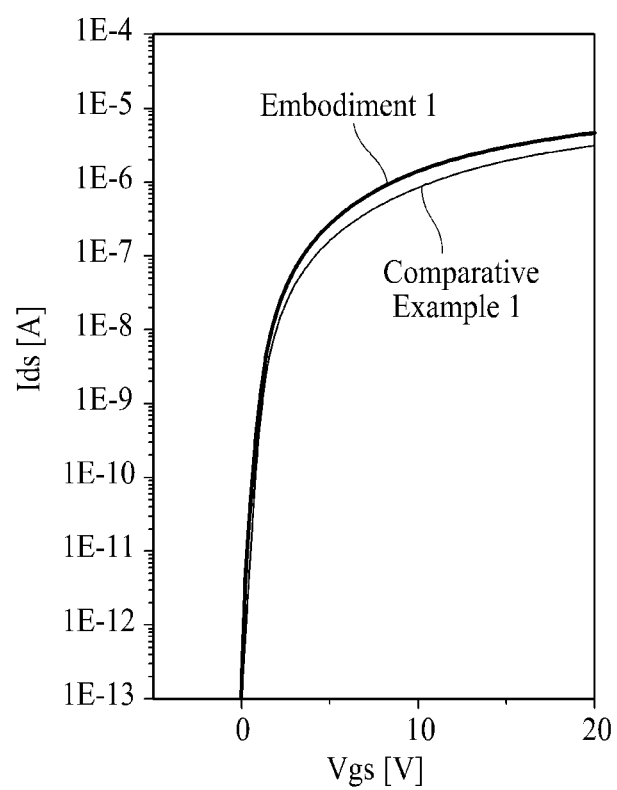
FIG. 7 is a graph illustrating threshold voltages of thin film transistors.

The s-factor may be described by a current-change graph shown in FIG. 7, for example. FIG. 7 is a threshold voltage graph for the thin film transistors. In detail, FIG. 7 illustrates the drain-source current IDS for the gate voltage VGS. For the threshold voltage Vth of the graph shown in FIG. 7, an inverse gradient of a slope (the reciprocal) in the graph of the drain-source current IDS for the gate voltage VGS is the s-factor. When the slope of the graph is sharp, the s-factor is small, and when the slope of the graph is gentle, the s-factor is large. When the s-factor is large, a rate of change of the drain-source current IDS for the gate voltage is slow.

When the s-factor becomes large, since the rate of change of the drain-source current IDS with respect to the gate voltage becomes slow, it is easy to adjust a magnitude of the drain-source current IDS by adjusting the gate voltage VGS.

In the display device driven by the current, for example, in an organic light emitting display device, a gray scale of a pixel may be controlled by adjusting the magnitude of the drain-source current IDS of the driving thin film transistor. The magnitude of the drain-source current IDS of the driving thin film transistor is determined by the gate voltage. Therefore, in the organic light emitting display device driven by the current, it is easy to adjust a gray scale of a pixel as the s-factor of the driving thin film transistor becomes large.

According to one embodiment of the present disclosure, since the first conductive material layer 171 overlaps the second area of the channel portion 130n adjacent to the source electrode 162, the first conductive material layer 171 may electrically affect the second area of the channel portion 130n when the same voltage as that of the source electrode 162 is applied to the first conductive material layer 171. Due to the electrical influence of the first conductive material layer 171, the electric field effect applied to the second area of the channel portion 130n by the first gate electrode 151 may be reduced. As a result, the s-factor of the thin film transistor 100, which includes the first conductive material layer 171, may be increased.

The influence of the first conductive material layer 171 on the s-factor of the thin film transistor 100 may be described by FIGS. 8A, 8B, 9A and 9B.

Figure 8A:
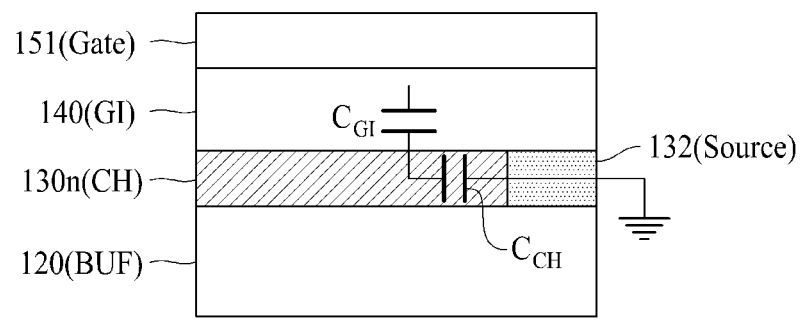
FIGS. 8A and 8B are schematic views illustrating an effective gate voltage of a thin film transistor.
Figure 8B:
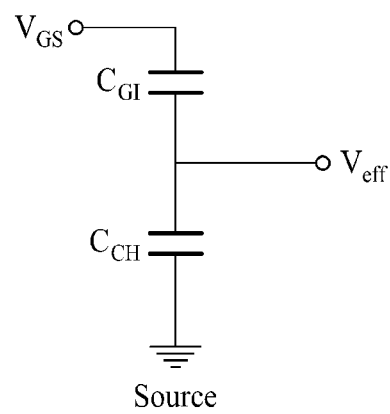

FIGS. 8A and 8B are schematic views illustrating an effective gate voltage Veff of a thin film transistor (Comparative Example 1) that has a structure similar to that of FIG. 1B but does not have the first conductive material layer 171.

FIG. 8A schematically illustrates a capacitance that may be generated when a gate voltage $V_{GS}$ is applied to the thin film transistor. The gate voltage $V_{GS}$ is a voltage between the source electrode 162 and the first gate electrode 151. According to one embodiment of the present disclosure, the gate voltage $V_{GS}$ may be referred to as a voltage between the second connection portion 132 and the first gate electrode 151.

FIG. 8A schematically illustrates the relationship between the threshold voltage Vth and the capacitance in the vicinity of the threshold voltage Vth before the thin film transistor is completely turned on.

As shown in FIG. 8A, when the gate voltage $V_{GS}$ is applied to the thin film transistor (Comparative Example 1) that does not have the first conductive material layer 171, a capacitance $C_{GI}$ may be formed between the channel portion 130n of the active layer 130 and the first gate electrode 151 (Gate), and a capacitance $C_{CH}$ may be also formed between the channel portion 130n and the second connection portion 132 (Source).

The capacitance $C_{CH}$ formed between the channel portion 130n and the second connection portion 132 (Source) may be referred to as a capacitance formed between the source electrode 162, which is a high voltage terminal, and the drain electrode 161, which is a low voltage terminal, in the channel portion 130n of the oxide semiconductor layer having N-type semiconductor characteristics.

The relationship between the capacitance and the voltage of FIG. 8A may be displayed as shown in FIG. 8B. Referring to FIG. 8B, due to the capacitance $C_{CH}$ between the channel portion 130n and the second connection portion 132 (Source), not all gate voltages $V_{GS}$ are effectively applied to the channel portion 130n. As a result, voltage loss may be generated.

Referring to FIG. 8B, when a portion of the gate voltages $V_{GS}$, which is effectively applied to the channel portion 130n during driving of the thin film transistor is referred to as the effective gate voltage Veff, the effective gate voltage Veff may be obtained by the following Equation 1.

$$Veff=[C_{GI}/(C_{GI}+C_{CH})]\times V_{GS} \qquad [\text{Equation 1}]$$

Figure 9A:
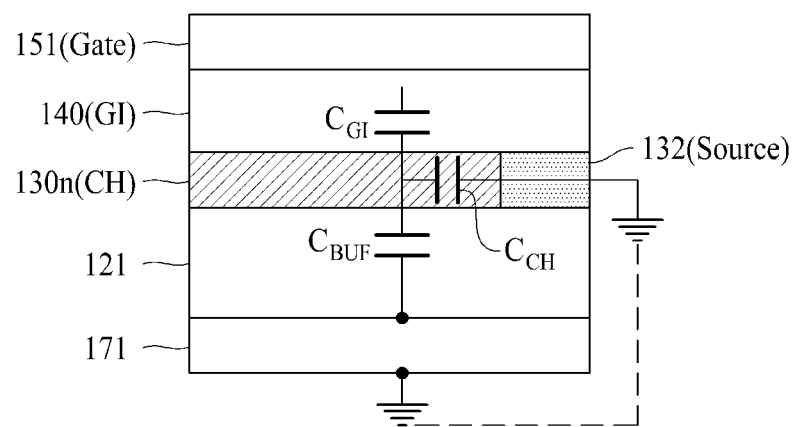
FIGS. 9A and 9B are schematic views illustrating an effective gate voltage of a thin film transistor according to one embodiment of the present disclosure.
Figure 9B:
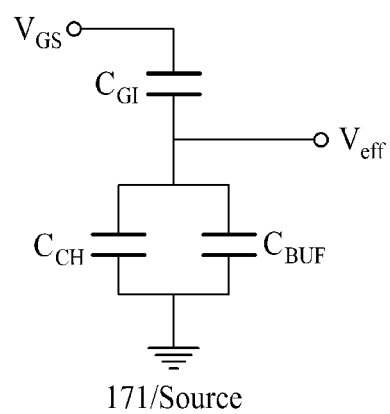

FIGS. 9A and 9B are schematic views illustrating the effective gate voltage Veff of the thin film transistor 100 according to one embodiment of the present disclosure.

FIG. 9A schematically illustrates a capacitance that may be generated when a gate voltage $V_{GS}$ is applied to the thin film transistor according to one embodiment of the present disclosure. FIG. 9A schematically illustrates the relationship between the threshold voltage Vth and the capacitance in the vicinity of the threshold voltage Vth before the thin film transistor is completely turned on.

As shown in FIG. 9A, when the gate voltage $V_{GS}$ is applied to the thin film transistor, a capacitance $C_{GI}$ may be formed between the channel portion 130n of the active layer 130 and the first gate electrode 151, a capacitance $C_{CH}$ may be also formed between the channel portion 130n and the second connection portion 132, and a capacitance $C_{BUF}$ may be additionally formed between the channel portion 130n and the first conductive material layer 171.

The relationship between the capacitance and the voltage of FIG. 9A may be displayed as shown in FIG. 9B. Referring to FIG. 9B, due to the capacitance $C_{CH}$ between the channel portion 130n and the second connection portion 132 (Source) and the capacitance $C_{BUF}$ between the channel portion 130n and the first conductive material layer 171, not all gate voltages $V_{GS}$ are effectively applied to the channel portion 130n. As a result, voltage loss may be generated.

According to one embodiment of the present disclosure, the first conductive material layer 171 is electrically connected to the source electrode 162 and the second connection portion 132. As a result, the capacitance $C_{BUF}$ is additionally generated between the channel portion 130n and the first conductive material layer 171, whereby the capacitance that causes voltage loss is increased ($C_{CH}$+$C_{BUF}$).

Therefore, referring to FIG. 9B, when one of the gate voltages $V_{GS}$, which is effectively applied to the channel portion 130n, is referred to as the effective gate voltage Veff, the effective gate voltage Veff may be obtained by the following Equation 2.

$$Veff=[C_{GI}/(C_{GI}+C_{CH}+C_{BUF})]\times V_{GS} \qquad [\text{Equation 2}]$$

Referring to the Equation 2, due to the capacitance $C_{BUF}$ between the channel portion 130n and the first conductive material layer 171, a denominator portion of the Equation 2 is increased. Therefore, the decrease of the effective gate voltage Veff is relatively greater than the Equation 1. Therefore, when the gate voltage $V_{GS}$ is applied, the increased speed (rate of change) of the drain-source current IDS relative to the gate voltage $V_{GS}$ is decreased in the thin film transistor 100 according to one embodiment of the present disclosure, and as a result, the s-factor is increased.

According to one embodiment of the present disclosure, the first conductive material layer 171 overlaps the second area of the channel portion 130n. As a result, the effective gate voltage Veff may be reduced in the second area of the channel portion 130n, in which the source electrode 162 and the second connection portion 132 are connected to each other.

Therefore, according to one embodiment of the present disclosure, before the thin film transistor 100 is completely turned on, the increase of the current is delayed in the vicinity of the source electrode 162, whereby the increased speed (rate of change) of the drain-source current IDS is delayed, resulting in the increase of the s-factor. As described above, the first conductive material layer 171 may serve to increase the s-factor of the thin film transistor 100 according to one embodiment of the present disclosure.

On the other hand, the first area of the channel portion 130n, in which the drain electrode 161 and the first connection portion 131 are connected to each other, may not overlap the first conductive material layer 171. Therefore, the decrease of the effective gate voltage Veff is not large in the first area of the channel portion 130n. As a result, when the thin film transistor 100 according to one embodiment of the present disclosure is in an ON-state, charges may sufficiently actively move via the drain electrode 161 and the first area, so that the ON-current of the thin film transistor 100 is not reduced.

In the related art, a method of increasing a distance between the gate electrode and the channel portion was applied to increase the s-factor of the thin film transistor. In this case, the s-factor is increased but a problem occurs in that the ON-current of the thin film transistor is reduced.

On the other hand, according to one embodiment of the present disclosure, the first conductive material layer 171 is disposed to overlap the second area of the channel portion 130n, in which the source electrode 162 is connected to the second connection portion 132, so that the s-factor of the thin film transistor 100 is increased and the ON-current of the thin film transistor 100 is not reduced, whereby the thin film transistor 100 may have excellent ON-current characteristics.

Since the thin film transistor 100 according to one embodiment of the present disclosure has a large s-factor, the thin film transistor 100 may be used as a driving transistor of a display device.

Figure 1C:
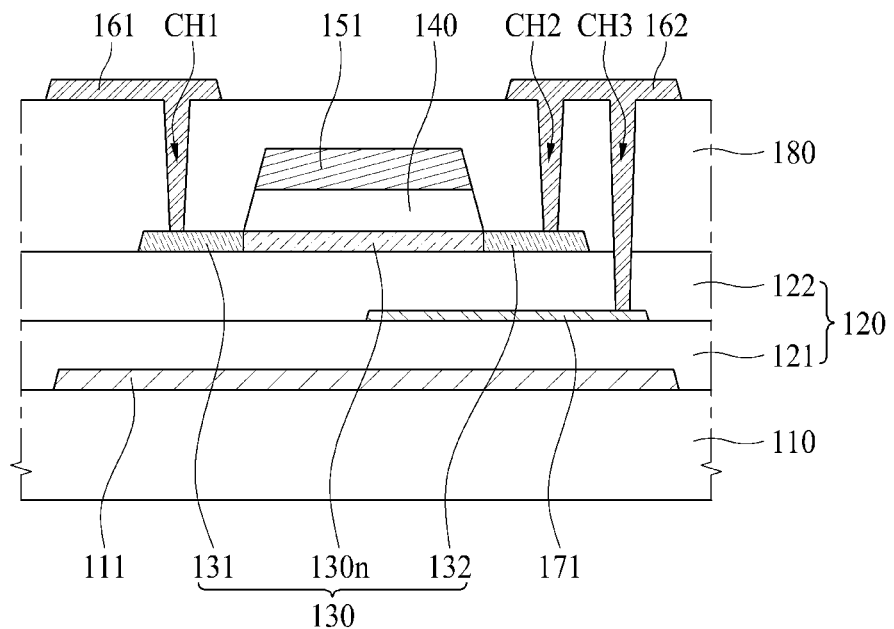

FIG. 1C is a cross-sectional view illustrating a thin film transistor according to another embodiment of the present disclosure. In order to avoid redundancy, the description of the elements that are already described will be omitted.

Referring to FIG. 1C, the gate insulating layer 140 may be patterned. In the thin film transistor shown in FIG. 1C, the gate insulating layer 140 may be patterned by etching using the first gate electrode 151 as a mask.

Figure 1D:
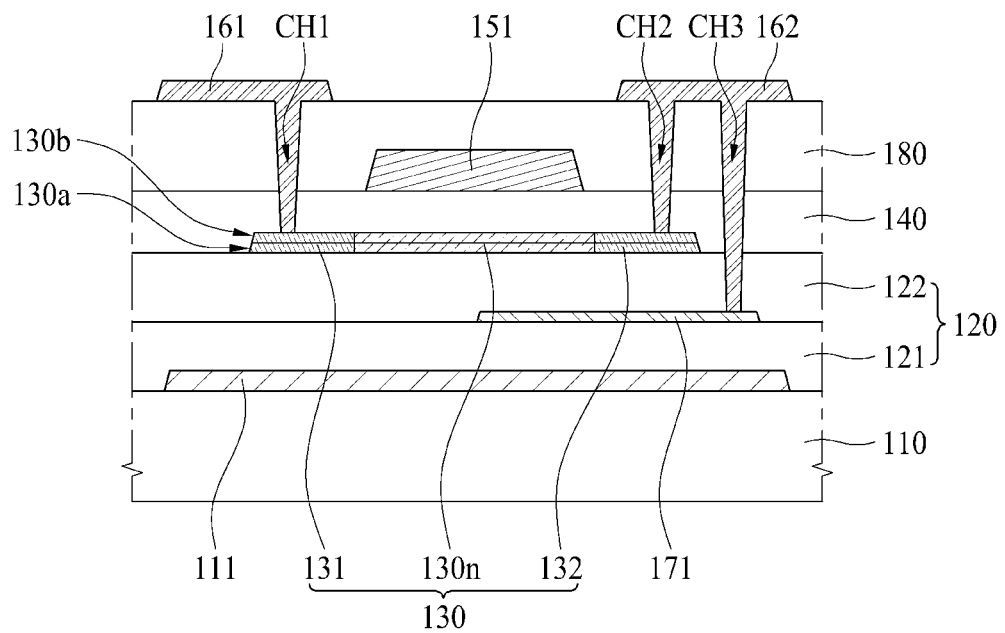
Figure 1E:
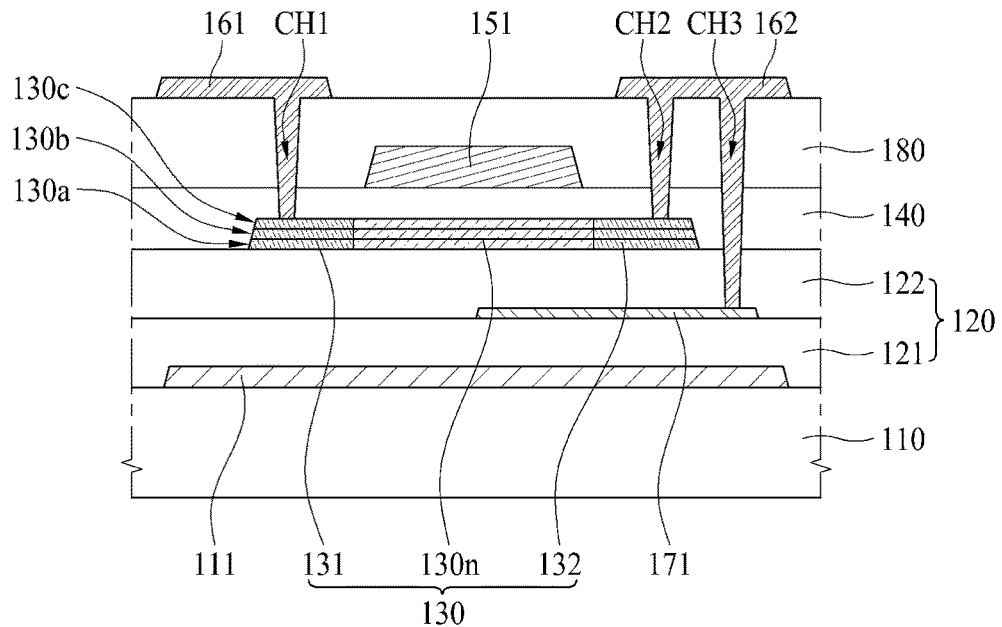

FIGS. 1D and 1E are cross-sectional views illustrating a thin film transistor according to another embodiment of the present disclosure.

The thin film transistor of FIG. 1D has a multi-layered structure in comparison with the thin film transistor 100 of FIG. 1B.

Referring to FIG. 1D, the active layer 130 includes a first oxide semiconductor layer 130a on the substrate 110 and a second oxide semiconductor layer 130b on the first oxide semiconductor layer 130a. The first oxide semiconductor layer 130a and the second oxide semiconductor layer 130b may include the same semiconductor material, or may include their respective semiconductor materials different from each other.

The first oxide semiconductor layer 130a supports the second oxide semiconductor layer 130b. Therefore, the first oxide semiconductor layer 130a is referred to as a "support layer". The channel portion 130n may be formed in the second oxide semiconductor layer 130b. Therefore, the second oxide semiconductor layer 130b is referred to as a "channel layer", but one embodiment of the present disclosure is not limited thereto, and the channel portion 130n may be formed in the first oxide semiconductor layer 130a.

A structure in which the active layer 130 includes a first oxide semiconductor layer 130a and a second oxide semiconductor layer 130b is referred to as a bi-layer structure.

In the thin film transistor of FIG. 1E, the active layer further includes a third oxide semiconductor layer 130c on the second oxide semiconductor layer 130b, in comparison with the thin film transistor of FIG. 1D.

Referring to FIG. 1E, the active layer 130 includes a first oxide semiconductor layer 130a, a second oxide semiconductor layer 130b and a third oxide semiconductor layer 130c, but other embodiments of the present disclosure are not limited thereto, and the active layer 130 may further include another semiconductor layer. With three oxide semiconductor layers, the middle layer 130b is protected from damage during manufacture in both directions, for example the bottom oxide semiconductor layer protects the middle semiconductor layer from gases during manufacture, and the top oxide semiconductor layer protects the middle semiconductor layer from etchant or gases during manufacture.

Figure 2:
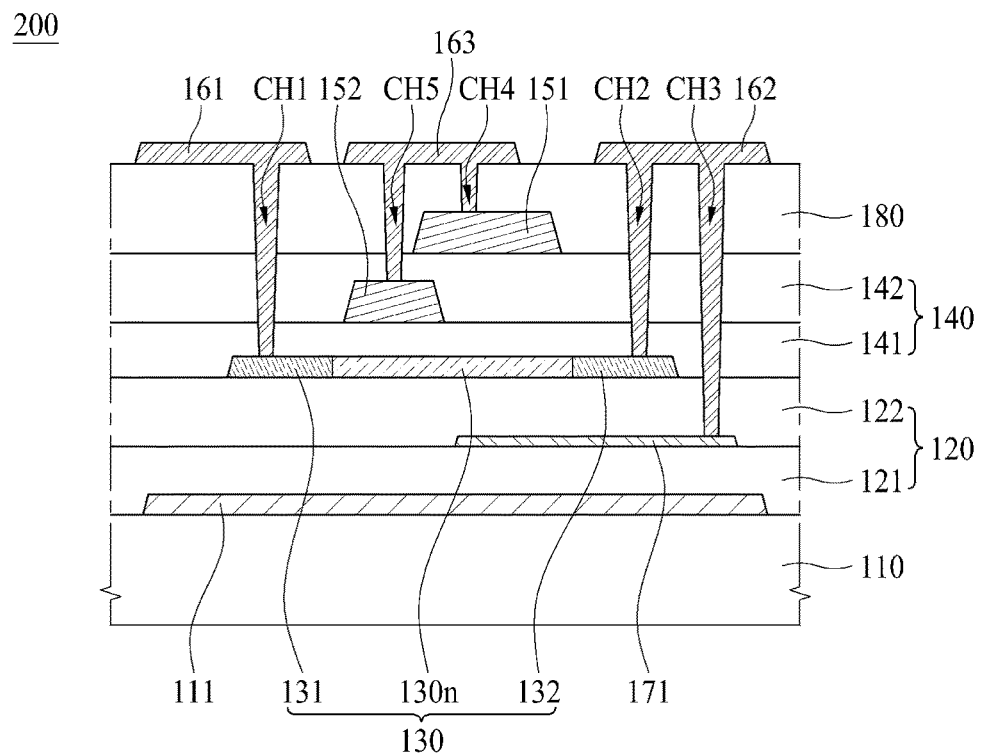
FIG. 2 is a cross-sectional view illustrating a thin film transistor according to another embodiment of the present disclosure.

FIG. 2 is a cross-sectional view illustrating a thin film transistor 200 according to another embodiment of the present disclosure.

The thin film transistor 200 of FIG. 2 further includes a second gate electrode 152 disposed between the first gate electrode 151 and the active layer 130, as compared with the thin film transistor 100 of FIG. 1B. Referring to FIG. 2, a first gate insulating layer 141 may be disposed on the active layer 130, a second gate electrode 152 may be disposed on the first gate insulating layer 141, a second gate insulating layer 142 may be disposed on the second gate electrode 152, and a first gate electrode 151 may be disposed on the second gate insulating layer 142. The thin film transistor 200 of FIG. 2 includes a first conductive material layer 171.

According to one embodiment of the present disclosure, the second gate electrode 152 overlaps the first area of the channel portion 130n. In addition, the second gate electrode 152 may be designed so as not to overlap the second area of the channel portion 130n. In this case, the second gate electrode 152 may not overlap the first conductive material layer 171.

Referring to FIG. 2, at least a portion of the second gate electrode 152 overlaps the first gate electrode 151, and at least a portion of the second gate electrode 152 may not overlap the first gate electrode 151. According to one embodiment of the present disclosure, only a portion of the second gate electrode 152 may overlap the first gate electrode 151.

According to one embodiment of the present disclosure, the same voltage may be applied to the first gate electrode 151 and the second gate electrode 152. Referring to FIG. 2, the first gate electrode 151 and the second gate electrode 152 may be electrically connected to each other by gate connection electrode 163 and the contact holes CH4 and CH5.

The second gate electrode 152 may serve as a gate electrode for applying an electric field to the channel portion 130n of the active layer 130, together with the first gate electrode 151.

According to one embodiment of the present disclosure, the second gate electrode 152 overlaps the first area of the channel portion 130n, in which the drain electrode 161 is connected with the first connection portion 131. Since the second gate electrode 152 is disposed to be closer to the channel portion 130n than the first gate electrode 151, an electric field may be applied to the first area of the channel portion 130n more efficiently than the first gate electrode 151. As a result, the ON-current of the thin film transistor 200 may be improved due to the second gate electrode 152.

On the other hand, the second gate electrode 152 may be designed so as not to overlap the second area of the channel portion 130n. Therefore, the second gate electrode 152 may not affect the electric field effect applied to the second area of the channel area 130n. Alternatively, even though the second gate electrode 152 overlaps the second area of the channel area 130n, the overlap area may be minimized to minimize the electric field effect on the second area of the channel portion 130n by the second gate electrode 152. As a result, even though the gate voltage is applied to the second gate electrode 152, it may not affect the increase speed (rate of change) of the drain-source current IDS. Therefore, even though the second gate electrode 152 is disposed, the s-factor of the thin film transistor 200 may not be reduced.

As described above, the second gate electrode 152 disposed between the first gate electrode 151 and the active layer 130 by overlapping the first area of the channel portion 130n may improve the ON-current of the thin film transistor 200 without reducing the s-factor of the thin film transistor 200.

Figure 3:
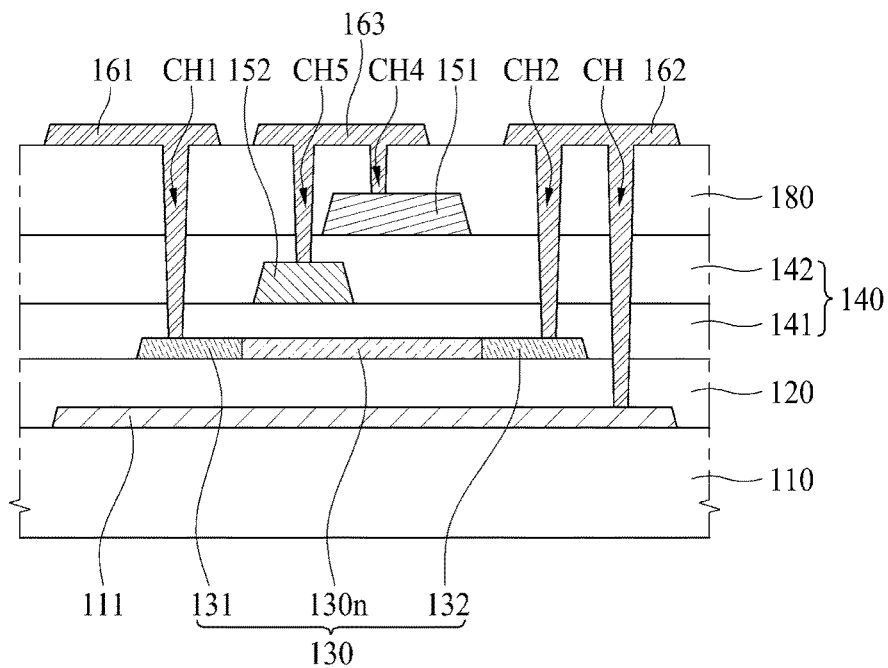
FIG. 3 is a cross-sectional view illustrating a thin film transistor according to another embodiment of the present disclosure.

FIG. 3 is a cross-sectional view illustrating a thin film transistor 300 according to still another embodiment of the present disclosure.

The thin film transistor 300 of FIG. 3 further includes a second gate electrode 152 disposed between the first gate electrode 151 and the active layer 130, in comparison with the thin film transistor 100 of FIG. 1B. In addition, the thin film transistor 300 of FIG. 3 may not include the first conductive material layer 171, in comparison with the thin film transistor 100 of FIG. 1B.

Referring to FIG. 3, the light shielding layer 111 may be connected to the source electrode 162 through a contact hole CH, but one embodiment of the present disclosure is not limited thereto, and the light shielding layer 111 may be electrically connected to the drain electrode 161 or the first gate electrode 151.

Referring to FIG. 3, the first gate insulating layer 141 may be disposed on the active layer 130, the second gate electrode 152 may be disposed on the first gate insulating layer 141, the second gate insulating layer 142 may be disposed on the second gate electrode 152, and the first gate electrode 151 may be disposed on the second gate insulating layer 142.

According to one embodiment of the present disclosure, the second gate electrode 152 overlaps the first area of the channel portion 130n. In the thin film transistor 300 of FIG. 3, an area of the channel portion 130n, which overlaps the second gate electrode 152, may be referred to as the first area, and an area of the channel portion 130n, which does not overlap the second gate electrode 152, may be referred to as the second area.

In detail, the area of the channel portion 130n, which overlaps the first gate electrode 151 and does not overlap the second gate electrode 152, may be referred to as the second area.

Referring to FIG. 3, at least a portion of the second gate electrode 152 may overlap the first gate electrode 151, and at least a portion of the second gate electrode 152 may not overlap the first gate electrode 151. According to one embodiment of the present disclosure, only a portion of the second gate electrode 152 may overlap the first gate electrode 151.

According to one embodiment of the present disclosure, the same voltage may be applied to the first gate electrode 151 and the second gate electrode 152. Referring to FIG. 3, the first gate electrode 151 and the second gate electrode 152 may be electrically connected to each other by the gate connection electrode 163 and the contact holes CH4 and CH5.

The second gate electrode 152 may serve as a gate electrode for applying an electric field to the channel portion 130n of the active layer 130, together with the first gate electrode 151.

Since the second gate electrode 152 is disposed to be closer to the channel portion 130n than the first gate electrode 151, an electric field may be applied to the first area of the channel portion 130n more efficiently than the first gate electrode 151. Due to the second gate electrode 152, since the first area to which a high voltage is applied has a large electric field effect, the ON-current of the thin film transistor 200 may be improved.

The second area of the channel portion 130n overlaps the first gate electrode 151 without overlapping the second gate electrode 152. The second area of the channel portion 130n is subjected to the electric field effect by the first gate electrode 151. However, the first gate electrode 151 is spaced apart from the channel portion 130n to be farther than the second gate electrode 152. Therefore, the electric field effect applied to the second area of the channel portion 130n is smaller than the electric field effect applied to the first area of the channel portion 130n. As a result, when the gate voltage is applied to the first gate electrode 151 and the second gate electrode 152, since the electric field effect applied to the second area is small, the increase speed (rate of change) of the drain-source current IDS is very small and thus the slope of the threshold voltage graph is small. Therefore, the thin film transistor 300 shown in FIG. 3 may have a large s-factor.

As described above, the thin film transistor 300 of FIG. 3, which includes the second gate electrode 152 disposed between the first gate electrode 151 and the active layer 130 by overlapping the first area of the channel portion 130n, has a relatively large s-factor and at the same time may have excellent on-current characteristics.

Figure 4A:
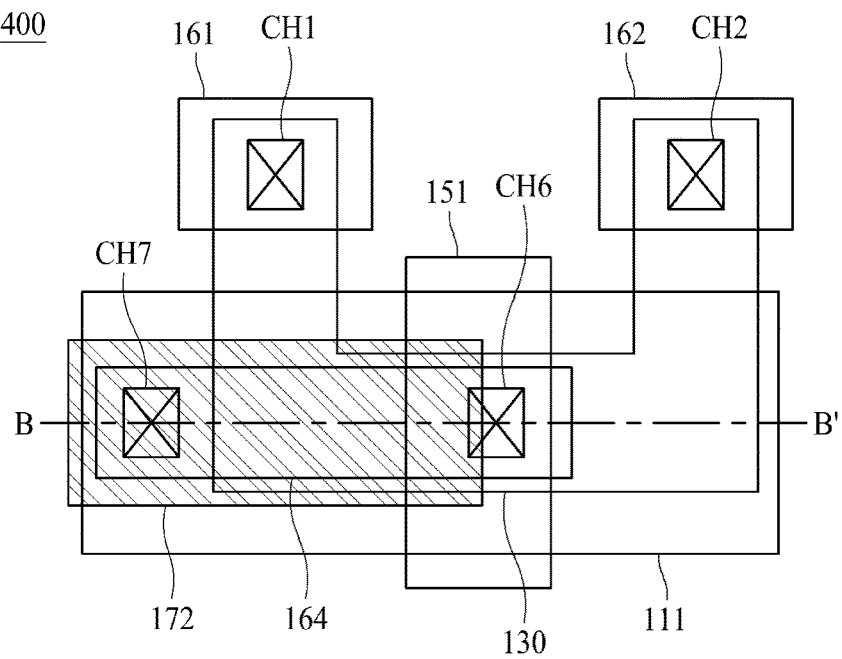
FIG. 4A is a plan view illustrating a thin film transistor according to another embodiment of the present disclosure.
Figure 4B:
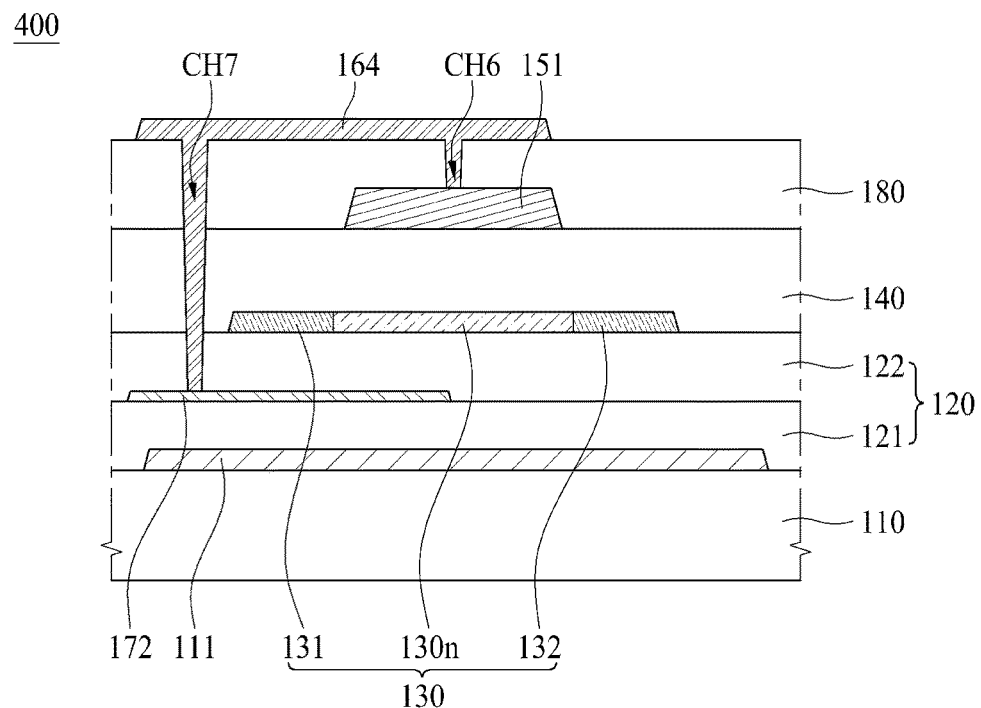
FIG. 4B is a cross-sectional view illustrating a thin film transistor according to embodiment example of the present disclosure.

FIG. 4A is a plan view illustrating a thin film transistor 100 according to still another embodiment of the present disclosure, and FIG. 4B is a cross-sectional view illustrating a thin film transistor 400 according to still another embodiment of the present disclosure. In detail, FIG. 4B is a cross-sectional view taken along line B-B' of FIG. 4A.

Referring to FIGS. 4A and 4B, the thin film transistor 400 may include a second conductive material layer 172 between the substrate 110 and the active layer 130. The second conductive material layer 172 may overlap the first area of the channel portion 130n, and may not overlap the second area of the channel portion 130n. The thin film transistor 400 of FIG. 4B does not include the first conductive material layer 171 and includes the second conductive material layer 172 in comparison with the thin film transistor 100 of FIG. 1B.

According to still another embodiment of the present disclosure, an area of the channel portion 130n, which overlaps the second conductive material layer 172, may be referred to as the first area, and an area of the channel portion 130n, which does not overlap the second conductive material layer 172, may be referred to as the second area.

According to still another embodiment of the present disclosure, the second conductive material layer 172 may be configured to have the same voltage as that of the first gate electrode 151. Referring to FIG. 4B, the second conductive material layer 172 may be connected to the first gate electrode 151. In detail, the second conductive material layer 172 may be connected to the first gate electrode 151 by a connection electrode 164 on the interlayer insulating layer 180 and contact holes CH6 and CH7.

The same gate voltage as that applied to the first gate electrode 151 may be applied to the second conductive material layer 172. The thin film transistor 400 of FIG. 4B may have a double gate structure. Due to the double gate structure, the electric field effect applied to the first area of the channel portion 130n of FIG. 4B may be increased.

Figure 10A:
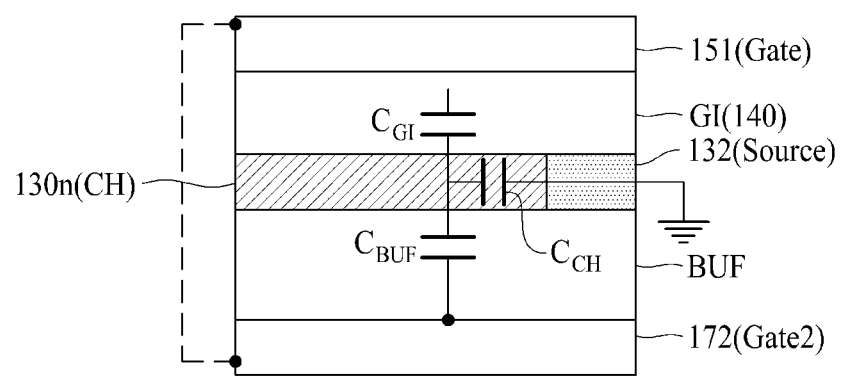
FIGS. 10A and 10B are schematic views illustrating an effective gate voltage of a thin film transistor according to another embodiment of the present disclosure.
Figure 10B:
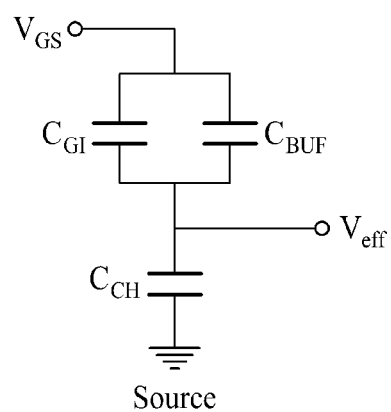

The effective gate voltage Veff by the second conductive material layer 172 may be described by FIGS. 10A and 10B.

FIG. 10A schematically illustrates a capacitance that may be generated when a gate voltage $V_{GS}$ is applied to the thin film transistor 400 of FIG. 4B. FIG. 10A schematically illustrates the relationship between the threshold voltage Vth and the capacitance in the vicinity of the threshold voltage Vth before the thin film transistor 400 is completely turned on.

As shown in FIG. 10A, when the gate voltage $V_{GS}$ is applied to the thin film transistor 400, a capacitance $C_{GI}$ is formed between the channel portion 130n and the first gate electrode 151, and a capacitance $C_{CH}$ is formed between the channel portion 130n and the second connection portion 132.

Also, referring to FIG. 10A, a capacitance $C_{BUF}$ may be formed between the channel portion 130n and the second conductive material layer 172. The capacitance $C_{BUF}$ between the channel portion 130n and the second conductive material layer 172 may be referred to as the capacitance formed between the first area of the channel portion 130n and the second conductive material layer 172.

The relationship between the capacitance and the voltage of FIG. 10A may be displayed as shown in FIG. 10B.

According to one embodiment of the present disclosure, since the second conductive material layer 172 and the first gate electrode 151 are electrically connected to each other, an effect such as applying the gate voltage to the first area of the channel portion 130n is generated by the second conductive material layer 172. As a result, an effect of increasing the effective gate voltage Veff corresponding to the capacitance $C_{BUF}$ between the channel portion 130n and the second conductive material layer 172 is generated.

Referring to FIG. 10B, when the thin film transistor 400 is driven, the effective gate voltage Veff applied to the first area of the channel portion 130n may be obtained by the following Equation 3.

$$V\text{eff}=[C_{GI}+C_{BUF})/(C_{GI}+C_{CH}+C_{BUF})]\times V_{GS} \quad \text{[Equation 3]}$$

Referring to the Equation 3, due to the capacitance $C_{BUF}$ between the channel portion 130n and the second conductive material layer 172, a molecular portion of the Equation 3 was increased in comparison with the Equation 2. In this way, as the effective gate voltage Veff applied to the first area of the channel portion 130n is increased, the ON-current of the thin film transistor 400 may be improved.

Therefore, in order to increase the s-factor of the thin film transistor 400, even though the spaced distance between the channel portion 130n of the active layer 130 and the first gate electrode 151 is significantly increased, the ON-current of the thin film transistor 400 may not be reduced.

Referring to FIG. 4B, as the spaced distance between the channel portion 130n of the active layer 130 and the first gate electrode 151 is significantly increased, the s-factor of the thin film transistor 400 may be increased. Also, the second conductive material layer 172 overlapped with the first area of the channel portion 130n and connected to the first gate electrode 151 may be disposed so that the ON-current of the thin film transistor 400 may not be reduced.

As described above, the thin film transistor 400 of FIG. 4B may include the second conductive material layer 172 overlapped with the first area of the channel portion 130n and connected to the first gate electrode 151, so that the thin film transistor 400 may have a relatively large s-factor and excellent ON-current characteristics.

Figure 5:
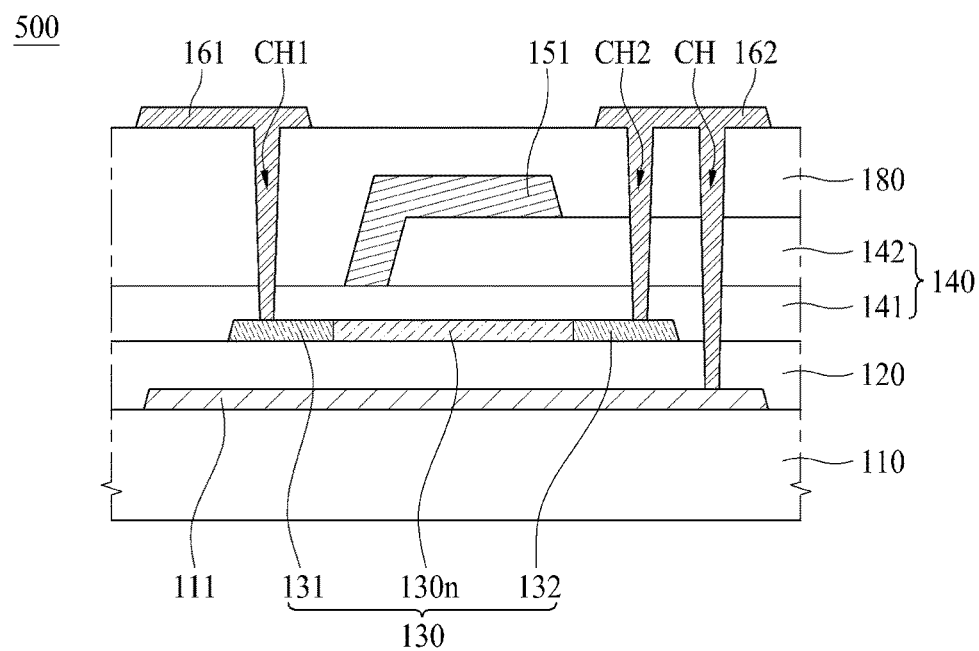
FIG. 5 is a cross-sectional view illustrating a thin film transistor according to another embodiment of the present disclosure.

FIG. 5 is a cross-sectional view illustrating a thin film transistor 500 according to further still another embodiment of the present disclosure.

Referring to FIG. 5, the thin film transistor 500 according to further still another embodiment of the present disclosure includes a first gate electrode 151 having a step difference.

Referring to FIG. 5, the gate insulating layer 140 between the first gate electrode 151 and the active layer 130 has a step difference. In detail, the gate insulating layer 140 may include a first gate insulating layer 141 and a second gate insulating layer 142. The first gate insulating layer 141 may cover the entire area of the channel portion 130n. The second gate insulating layer 142 may cover only a portion of the channel portions 130n. In more detail, the second gate insulating layer 142 may cover only an area adjacent to the second connection portion 132 of the channel portion 130n.

Referring to FIG. 5, an area of the channel portion 130n, which does not overlap the second gate insulating layer 142, may be referred to as a first area, and an area of the channel portion 130n, which overlaps the second gate insulating layer 142, may be referred to as a second area.

Therefore, in the thin film transistor 500 shown in FIG. 5, a thickness of the gate insulating layer 140 disposed on the first area of the channel portion 130n is less than the thickness of the gate insulating layer 140 disposed on the second area of the channel portion 130n. Also, a distance between the first gate electrode 151 and the first area of the channel portion 130n is less than the distance between the first gate electrode 151 and the second area of the channel portion 130n.

The thin film transistor 500 shown in FIG. 5 may have an effect similar to that of the thin film transistor 300 that includes the second gate electrode 152 shown in FIG. 3.

In detail, since the first area of the channel portion 130n is disposed to be close to the first gate electrode 151, the electric field effect applied to the first area is relatively large. As described above, since the first area to which a high voltage is applied is subjected to a large electric field effect, the ON-current of the thin film transistor 500 may be improved.

Since the second area of the channel portion 130n is relatively far from the first gate electrode 151, the electric field effect applied to the second area of the channel portion 130n is relatively small. As a result, when the gate voltage is applied to the first gate electrode 151, the electric field effect applied to the second area is small, and the increased speed (rate of change) of the drain-source current IDS is very small, whereby the slope of the threshold voltage graph is small. Therefore, the thin film transistor 500 shown in FIG. 5 may have a large s-factor.

In this way, the thin film transistor 500 of FIG. 5 has a relatively large s-factor, and at the same time may have excellent ON-current characteristics.

Figure 6A:
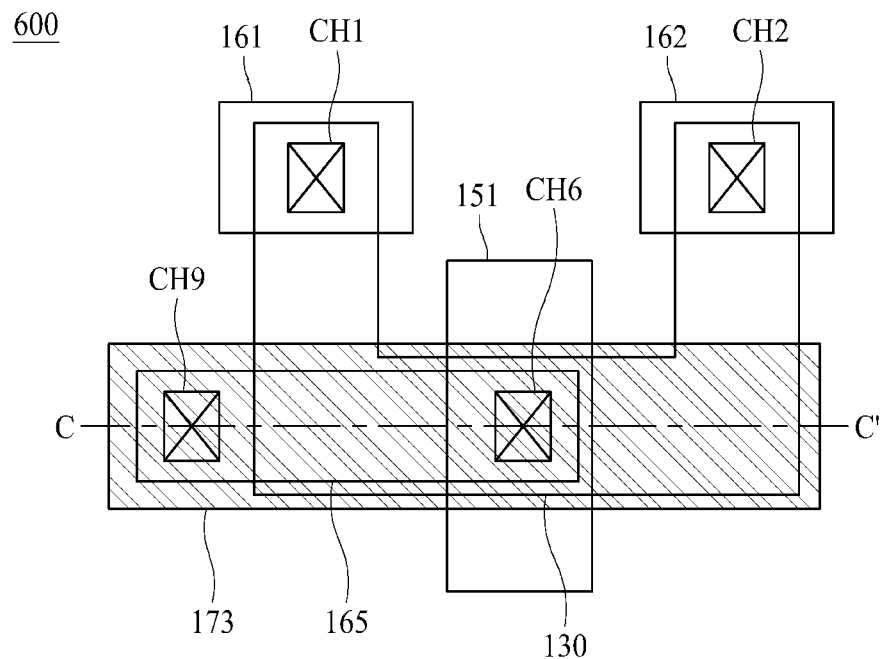
FIG. 6A is a plan view illustrating a thin film transistor according to another embodiment of the present disclosure.
Figure 6B:
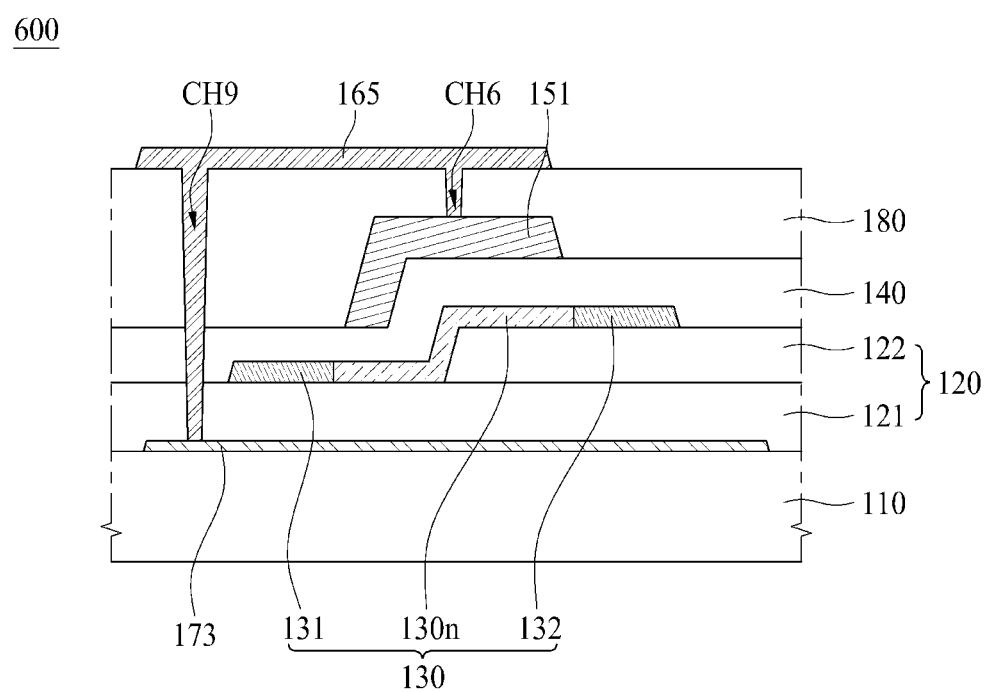
FIG. 6B is a cross-sectional view illustrating a thin film transistor according to another embodiment of the present disclosure.

FIG. 6A is a plan view illustrating a thin film transistor 600 according to further still another embodiment of the present disclosure, and FIG. 6B is a cross-sectional view illustrating a thin film transistor 600 according to further still another embodiment of the present disclosure. FIG. 6B is a cross-sectional view taken along line C-C' of FIG. 6A according to further still another embodiment of the present disclosure.

The thin film transistor 600 of FIGS. 6A and 6B includes a third conductive material layer 173 disposed between the substrate 110 and the active layer 130. A buffer layer 120 is disposed between the third conductive material layer 173 and the active layer 130. The buffer layer 120 has a step profile.

In detail, the third conductive material layer 173 is disposed on the substrate 110, and the buffer layer 120 is disposed on the third conductive material layer 173. The buffer layer 120 may include, for example, a first buffer layer 121 and a second buffer layer 122.

The first buffer layer 121 may be disposed to fully overlap the channel portion 130n. The second buffer layer 122 may be disposed to overlap a portion of the channel portion 130n. In more detail, the second buffer layer 122 overlaps an area of the channel portion 130n, which is adjacent to the second connection portion 132, and may not overlap an area of the channel portion 130n, which is adjacent to the first connection portion 131.

Referring to FIG. 6B, an area of the channel portion 130n, which does not overlap the second buffer layer 122, may be referred to as a first area, and an area of the channel portion 130n, which overlaps the second buffer layer 122, may be referred to as a second area.

Therefore, in the thin film transistor 600 shown in FIG. 6B, a thickness of the buffer layer 120 that overlaps the first area of the channel portion 130n, is smaller than that of the buffer layer 120 that overlaps the second area of the channel portion 130n.

The active layer 130 is disposed on the buffer layer 120. As shown in FIG. 6B, since the buffer layer 120 has a step profile, the active layer 130 may also have a step profile. In more detail, the channel portion of the active layer 130 may have a step profile.

Since the buffer layer 120 has a step profile, a distance between the third conductive material layer 173 and the first area of the channel portion 130n may be smaller than that between the third conductive material layer 173 and the second area of the channel portion 130n.

Referring to FIG. 6B, due to the step difference of the buffer layer 120, the channel portion 130n of the active layer 130 and the first gate electrode 151 may have a step difference.

Referring to FIG. 6B, the third conductive material layer 173 may be connected to the first gate electrode 151. In detail, the third conductive material layer 173 may be connected to the first gate electrode 151 by a connection electrode 165 and contact holes CH6 and CH9 on the interlayer insulating layer 180.

According to further still another embodiment of the present disclosure, the third conductive material layer 173 may be configured to have the same voltage as that of the first gate electrode 151. The same gate voltage as that applied to the first gate electrode 151 may be applied to the third conductive material layer 173. The thin film transistor 600 of FIG. 6B may have a double gate structure.

There is no big difference in the distances between the first gate electrode 151 and the respective areas of the channel portion 130n. On the other hand, there is a difference in the distances between the third conductive material layer 173 and the respective areas of the channel portion 130n.

Since the first area of the channel portion 130n is disposed to be close to the third conductive material layer 173, the electric field effect applied to the first area is relatively large. As described above, since the first area to which the high voltage is applied is subjected to a large electric field effect, the ON-current of the thin film transistor 600 may be improved.

Since the second area of the channel portion 130n is relatively far away from the third conductive material layer 173, the electric field effect applied to the second area of the channel portion 130n is relatively small. As a result, when the gate voltage is applied to the third conductive material layer 173, the electric field effect applied to the second area is small and the increase speed (rate of change) of the drain-source current IDS is very small, whereby the slope of the threshold voltage graph is small. Therefore, the thin film transistor 600 shown in FIG. 6B may have a large s-factor.

As described above, the thin film transistor 600 of FIG. 6B has a relatively large s-factor, and at the same time may have excellent ON-current characteristics.

FIG. 7 is a threshold voltage graph for thin film transistors. The threshold voltage graph for the thin film transistors is represented by a graph of the drain-source current IDS with respect to the gate voltage $V_{GS}$.

In FIG. 7, "Embodiment 1" is a threshold voltage graph for the thin film transistor 100 of FIG. 1B. In FIG. 7, "Comparative Example 1" is a threshold voltage graph of the thin film transistor according to Comparative Example 1. In comparison with the thin film transistor 100 of FIG. 1B, the thin film transistor according to the Comparative Example 1 has a great thickness of the gate insulating layer 140 to increase the s-factor of the thin film transistor instead of having the first conductive material layer 171, whereby the spaced distance between the channel portion 130n and the first gate electrode 151 is increased.

Referring to FIG. 7, it is noted that there is no difference in the s-factor between the Embodiment 1 and the Comparative Example 1 before the thin film transistor is completely turned on. On the other hand, it is noted that the ON-current of Comparative Example 1 is less than the ON-current of the Embodiment 1.

As described above, according to one embodiment of the present disclosure, the thin film transistor having a large s-factor and having excellent on-current characteristics may be fabricated.

Hereinafter, the display device comprising the above-described thin film transistors 100, 200, 300, 400, 500 and 600 will be described in detail. The display device may comprise an LED, OLED, LCD, PDP, microLED, or a miniLED display device.

Figure 11:
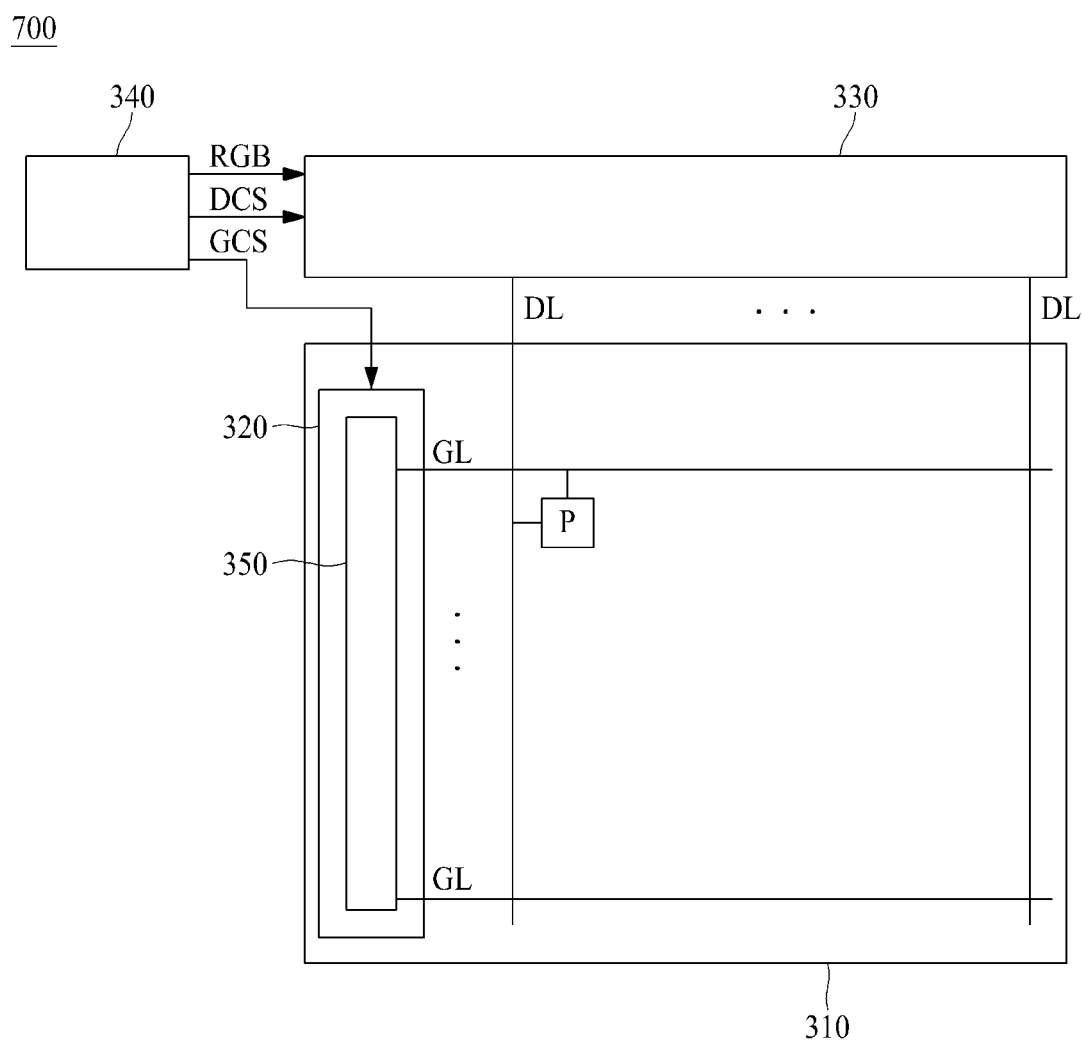
FIG. 11 is a schematic view illustrating a display device according to another embodiment of the present disclosure.

FIG. 11 is a schematic view illustrating a display device 700 according to another embodiment of the present disclosure.

As shown in FIG. 11, the display device 700 according to another embodiment of the present disclosure includes a display panel 310, a gate driver 320, a data driver 330 and a controller 340.

Gate lines GL and data lines DL are disposed in the display panel 310, and pixels P are disposed in intersection areas of the gate lines GL and the data lines DL. An image is displayed by driving of the pixels P.

The controller 340 controls the gate driver 320 and the data driver 330.

The controller 340 outputs a gate control signal GCS for controlling the gate driver 320 and a data control signal DCS for controlling the data driver 330 by using a signal supplied from an external system (not shown). Also, the controller 340 samples input image data input from the external system, realigns the sampled data and supplies the realigned digital image data RGB to the data driver 330.

The gate control signal GCS includes a gate start pulse GSP, a gate shift clock GSC, a gate output enable signal GOE, a start signal Vst and a gate clock GCLK. Also, control signals for controlling a shift register may be included in the gate control signal GCS.

The data control signal DCS includes a source start pulse SSP, a source shift clock signal SSC, a source output enable signal SOE, and a polarity control signal POL.

The data driver 330 supplies a data voltage to the data lines DL of the display panel 310. In detail, the data driver 330 converts the image data RGB input from the controller 340 into an analog data voltage, and supplies the data voltage to the data lines DL.

The gate driver 320 may include a shift register 350.

The shift register 350 sequentially supplies gate pulses to the gate lines GL for one frame by using the start signal and the gate clock, which are transmitted from the controller 340. In this case, one frame means a time period when one image is output through the display panel 310. The gate pulse has a turn-on voltage capable of turning on a switching element (thin film transistor) disposed in the pixel P.

Also, the shift register 350 supplies a gate-off signal capable of turning off a switching element, to the gate line GL for the other period of one frame, at which the gate pulse is not supplied. Hereinafter, the gate pulse and the gate-off signal will be collectively referred to as a scan signal SS or Scan.

According to one embodiment of the present disclosure, the gate driver 320 may be packaged on the substrate 110. In this way, a structure in which the gate driver 320 is directly packaged on the substrate 110 will be referred to as a gate-in-panel (GIP) structure.

Figure 12:
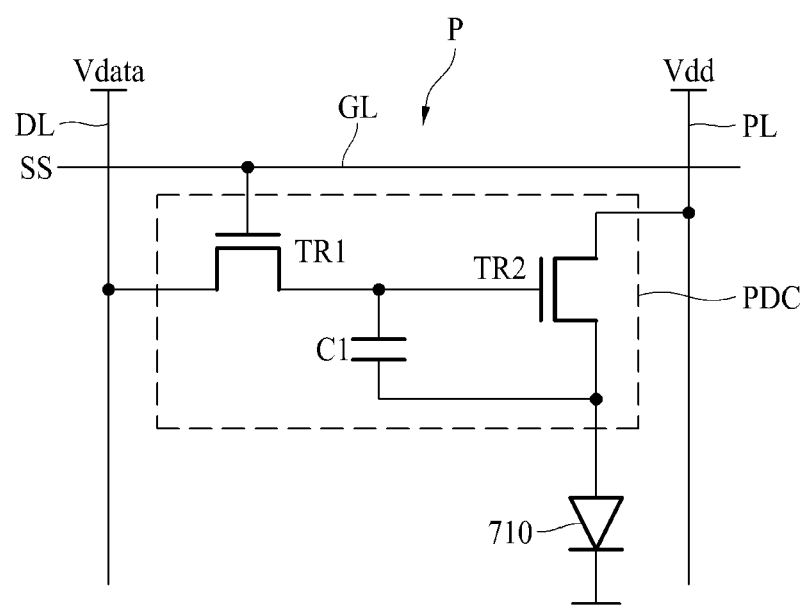
FIG. 12 is a circuit diagram illustrating any one pixel of FIG. 11 according to one embodiment of the present disclosure.
Figure 13:
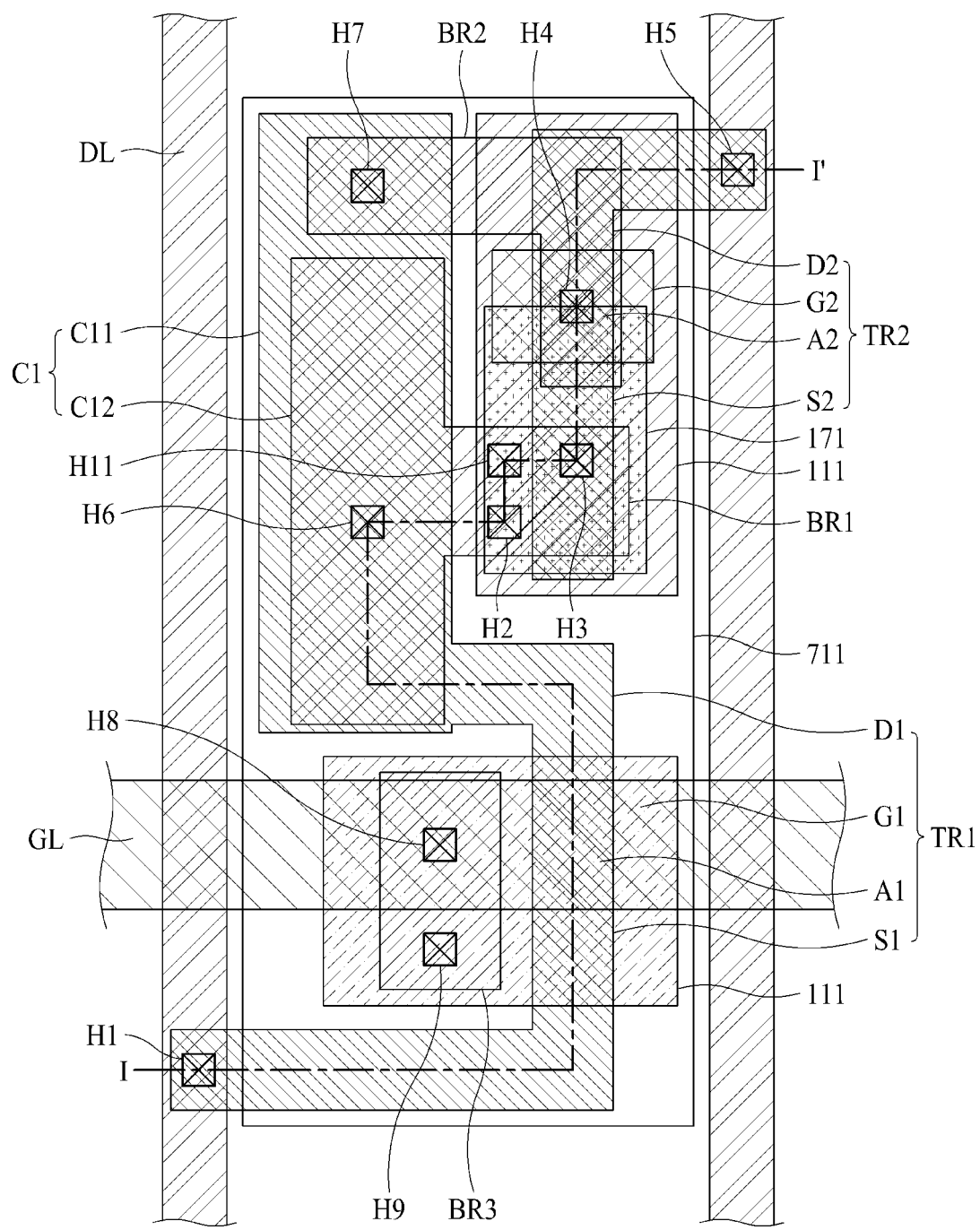
FIG. 13 is a plan view illustrating the pixel of FIG. 12 according to one embodiment of the present disclosure.
Figure 14:
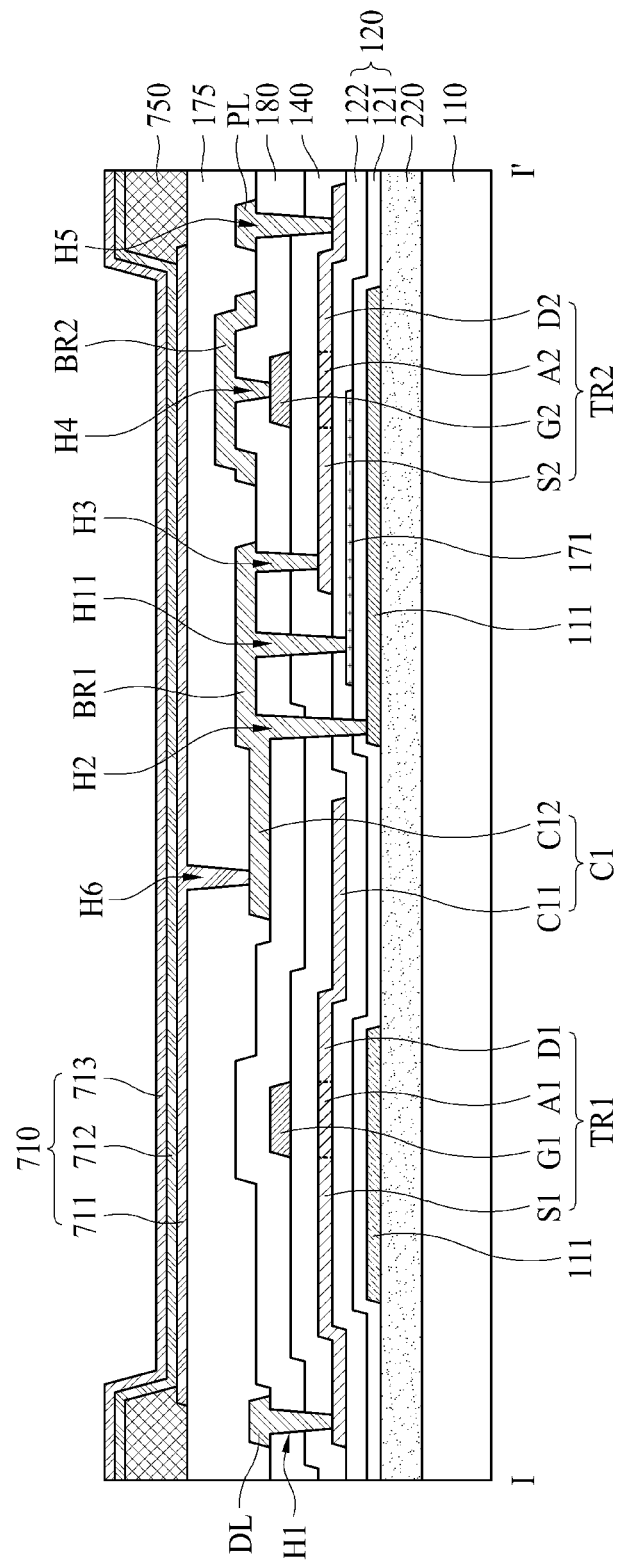
FIG. 14 is a cross-sectional view taken along line I-I' of FIG. 13 according to one embodiment of the present disclosure.

FIG. 12 is a circuit diagram illustrating any one pixel P of FIG. 11 according to one embodiment, FIG. 13 is a plan view illustrating a pixel P of FIG. 12 according to one embodiment, and FIG. 14 is a cross-sectional view taken along line I-I' of FIG. 13 according to one embodiment.

The circuit diagram of FIG. 12 is an equivalent circuit diagram for the pixel P of the display device 700 that includes an organic light emitting diode (OLED) as a display element 710.

The pixel P includes a display element 710 and a pixel driving circuit PDC for driving the display element 710.

The pixel driving circuit PDC of FIG. 12 includes a first thin film transistor TR1 that is a switching transistor and a second thin film transistor TR2 that is a driving transistor. For example, the thin film transistors 100, 200, 300, 400, 500 and 600 described in the embodiments may be used as the second thin film transistor TR2.

The first thin film transistor TR1 is connected to the gate line GL and the data line DL, and is turned on or off by the scan signal SS supplied through the gate line GL.

The data line DL provides a data voltage Vdata to the pixel driving circuit PDC, and the first thin film transistor TR1 controls applying of the data voltage Vdata.

A driving power line PL provides a driving voltage Vdd to the display element 710, and the second thin film transistor TR2 controls the driving voltage Vdd. The driving voltage Vdd is a pixel driving voltage for driving the organic light emitting diode (OLED) that is the display element 710.

When the first thin film transistor TR1 is turned on by the scan signal SS applied from the gate driver 320 through the gate line GL, the data voltage Vdata supplied through the data line DL is supplied to a gate electrode G2 of the second thin film transistor TR2 connected with the display element 710. The data voltage Vdata is charged in a first capacitor C1 formed between the gate electrode G2 and a source electrode S2 of the second thin film transistor TR2. The first capacitor C1 is a storage capacitor Cst.

The amount of a current supplied to the organic light emitting diode (OLED), which is the display element 710, through the second thin film transistor TR2 is controlled in accordance with the data voltage Vdata, whereby a gray scale of light emitted from the display element 710 may be controlled.

Referring to FIGS. 13 and 14, the first thin film transistor TR1 and the second thin film transistor TR2 are disposed on the substrate 110.

The substrate 110 may be made of glass or plastic. Plastic having a flexible property, for example, polyimide (PI) may be used as the substrate 110.

A lower buffer layer 220 is disposed on the substrate 110, and a light shielding layer 111 is disposed on the lower buffer layer 220. The light shielding layer 111 may comprise a material having light shielding characteristics. The light shielding layer 111 may shield light incident from the outside to protect active layers A1 and A2.

A first buffer layer 121 is disposed on the light shielding layer 111. The first buffer layer 121 is made of an insulating material, and protects the active layers A1 and A2 from external water or oxygen.

A first conductive material layer 171 is disposed on the first buffer layer 121.

According to one embodiment of the present disclosure, the first conductive material layer 171 may have electrical conductivity. Since the configuration and functions of the first conductive material layer 171 have been already described, the detailed description of the first conductive material layer 171 will be omitted to avoid redundancy.

A second buffer layer 122 is disposed on the first conductive material layer 171. The second buffer layer 122 may include at least one of insulating materials selected from a silicon oxide, a silicon nitride and a metal-based oxide.

The first active layer A1 of the first thin film transistor TR1 and the second active layer A2 of the second thin film transistor TR2 are disposed on the second buffer layer 122.

Each of the first active layer A1 and the second active layer A2 may include, for example, an oxide semiconductor material. Each of the first active layer A1 and the second active layer A2 may be made of an oxide semiconductor layer made of an oxide semiconductor material.

In the first thin film transistor TR1, the first active layer A1 may include a channel portion, a first connection portion and a second connection portion. The channel portion of the first active layer A1 overlaps the gate electrode G1. According to another embodiment of the present disclosure, the first connection portion may be referred to as a first source electrode S1, and the second connection portion may be referred to as a first drain electrode D1.

In the second thin film transistor TR2, the second active layer A2 may include a channel portion, a first connection portion and a second connection portion. The channel portion of the second active layer A2 overlaps the gate electrode G2. According to another embodiment of the present disclosure, the first connection portion may be referred to as a second drain electrode D2, and the second connection portion may be referred to as a second source electrode S2.

A portion of the channel portion of the second active layer A2 overlaps the first conductive material layer 171.

An area of the channel portion of the second active layer A2, which does not overlap the first conductive material layer 171, may be referred to as a first area, and an area of the channel portion of the second active layer A2, which overlaps the first conductive material layer 171, may be referred to as a second area. Therefore, the first conductive material layer 171 may not overlap the first area of the channel portion of the second active layer A2, and may overlap the second area of the channel portion of the second active layer A2.

Referring to FIGS. 13 and 14, a portion of the first active layer A1 may be conductorized to become a first capacitor electrode C11 of the first capacitor C1.

A gate insulating layer 140 is disposed on the first active layer A1 and the second active layer A2. The gate insulating layer 140 may cover entire upper surfaces of the first active layer A1 and the second active layer A2, or may cover only a portion of the first active layer A1 and the second active layer A2.

The gate electrode G1 of the first thin film transistor TR1 and the gate electrode G2 of the second thin film transistor TR2 are disposed on the gate insulating layer 140.

The gate electrode G1 of the first thin film transistor TR1 overlaps at least a portion of the first active layer A1 of the first thin film transistor TR1. The gate electrode G2 of the second thin film transistor TR2 overlaps at least a portion of the second active layer A2 of the second thin film transistor TR2.

An interlayer insulating layer 180 is disposed on the gate electrodes G1 and G2.

The data line DL and the driving power line PL are disposed on the interlayer insulating layer 180.

The data line DL is in contact with the first source electrode S1 formed in the first active layer A1 through a first contact hole H1. According to another embodiment of the present disclosure, a portion of the data line DL overlapped with the first active layer A1 may be referred to as the first source electrode S1.

The driving power line PL is in contact with the second drain electrode D2 formed in the second active layer A2 through a fifth contact hole H5. According to another embodiment of the present disclosure, a portion of the driving power line PL overlapped with the second active layer A2 may be referred to as the second drain electrode D2.

Referring to FIGS. 13 and 14, a second capacitor electrode C12 of the first capacitor C1, a first bridge BR1 and a second bridge BR2 are disposed on the interlayer insulating layer 180.

The second capacitor electrode C12 overlaps the first capacitor electrode C11 to form the first capacitor C1.

The first bridge BR1 may be integrally formed with the second capacitor electrode C12. The first bridge BR1 is connected to the light shielding layer 111 through a second contact hole H2, is connected to the first conductive material layer 171 through an eleventh contact hole H11, and is connected to the second source electrode S2 through a third contact hole H3. As a result, the first conductive material layer 171 may be connected to the second source electrode S2 of the second thin film transistor TR2.

The second bridge BR2 is connected to the gate electrode G2 of the second thin film transistor TR2 through a fourth contact hole H4, and is connected to the first capacitor electrode C11 of the first capacitor C1 through a seventh contact hole H7.

Also, referring to FIG. 13, a third bridge BR3 is disposed on the interlayer insulating layer 180. The third bridge BR3 is connected to the gate line GL through an eighth contact hole H8 and thus connected to the gate electrode G1, and is connected to the light shielding layer 111 of the first thin film transistor TR1 through a ninth contact hole H9. Although FIG. 13 illustrates that the light shielding layer 111 is connected to the gate electrode G1, one embodiment of the present disclosure is not limited thereto, and the light shielding layer 111 may be also connected to the first source electrode S1 or the first drain electrode D1.

A planarization layer 175 is disposed on the data line DL, the driving power line PL, the second capacitor electrode C12, the first bridge BR1, the second bridge BR2 and the third bridge BR3. The planarization layer 175 planarizes upper portions of the first thin film transistor TR1 and the second thin film transistor TR2, and protects the first thin film transistor TR1 and the second thin film transistor TR2.

A first electrode 711 of the display element 710 is disposed on the planarization layer 175. The first electrode 711 of the display element 710 is in contact with the second capacitor electrode C12 integrally formed with the first bridge BR1 through a sixth contact hole H6 formed in the planarization layer 175. As a result, the first electrode 711 may be connected to the second source electrode S2 of the second thin film transistor TR2.

A bank layer 750 is disposed at an edge of the first electrode 711. The bank layer 750 defines a light emission area of the display element 710.

An organic light emitting layer 712 is disposed on the first electrode 711, and a second electrode 713 is disposed on the organic light emitting layer 712. Therefore, the display element 710 is completed. The display element 710 shown in FIG. 14 is an organic light emitting diode (OLED). Therefore, the display device 700 according to one embodiment of the present disclosure is an organic light emitting display device.

According to another embodiment of the present disclosure, the second thin film transistor TR2 may have a large s-factor. The second thin film transistor TR2 may be used as a driving transistor to improve a gray representation capability of the display device 700.

Figure 15:
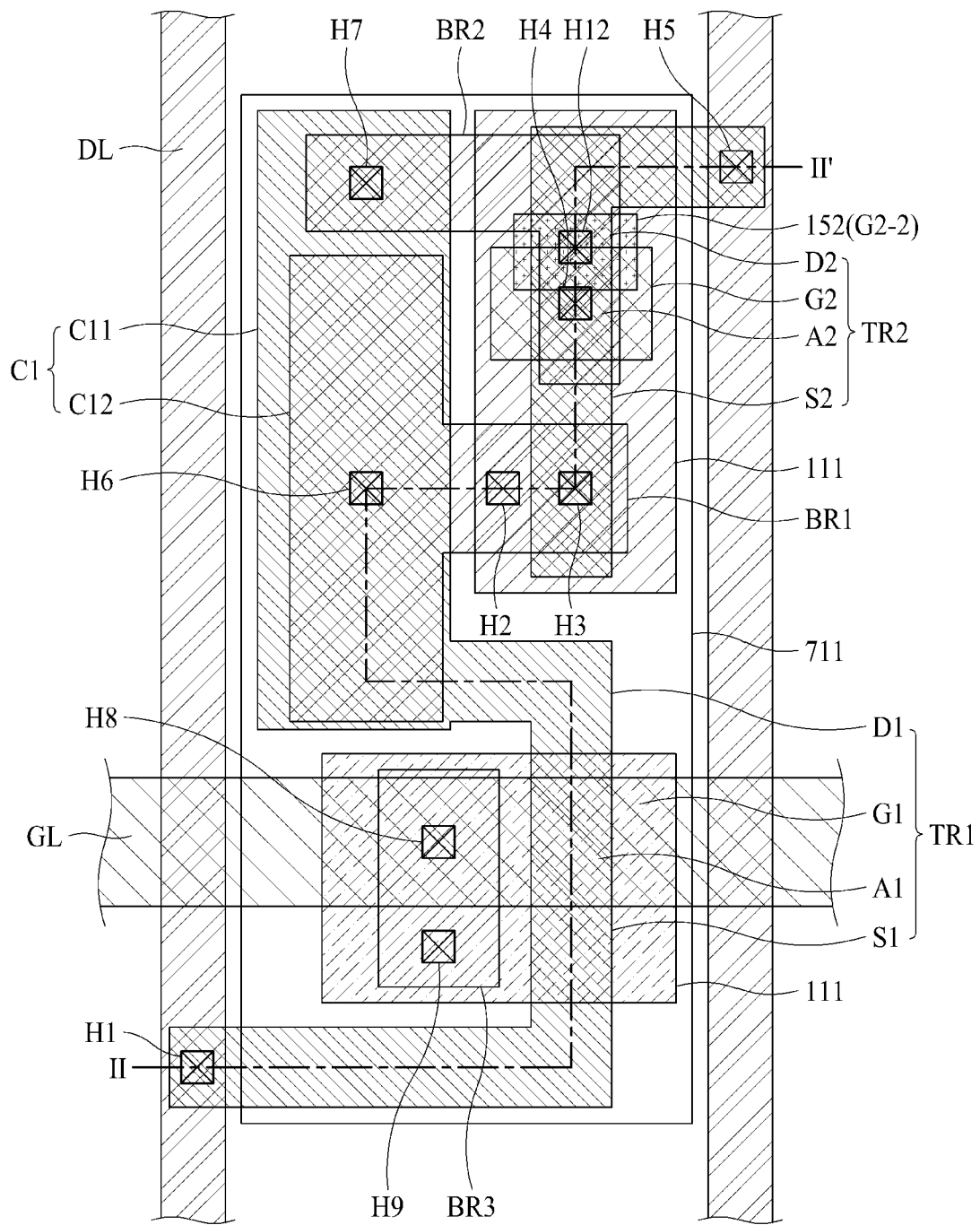
FIG. 15 is a circuit diagram illustrating any one pixel of a display device according to another embodiment of the present disclosure.
Figure 16:
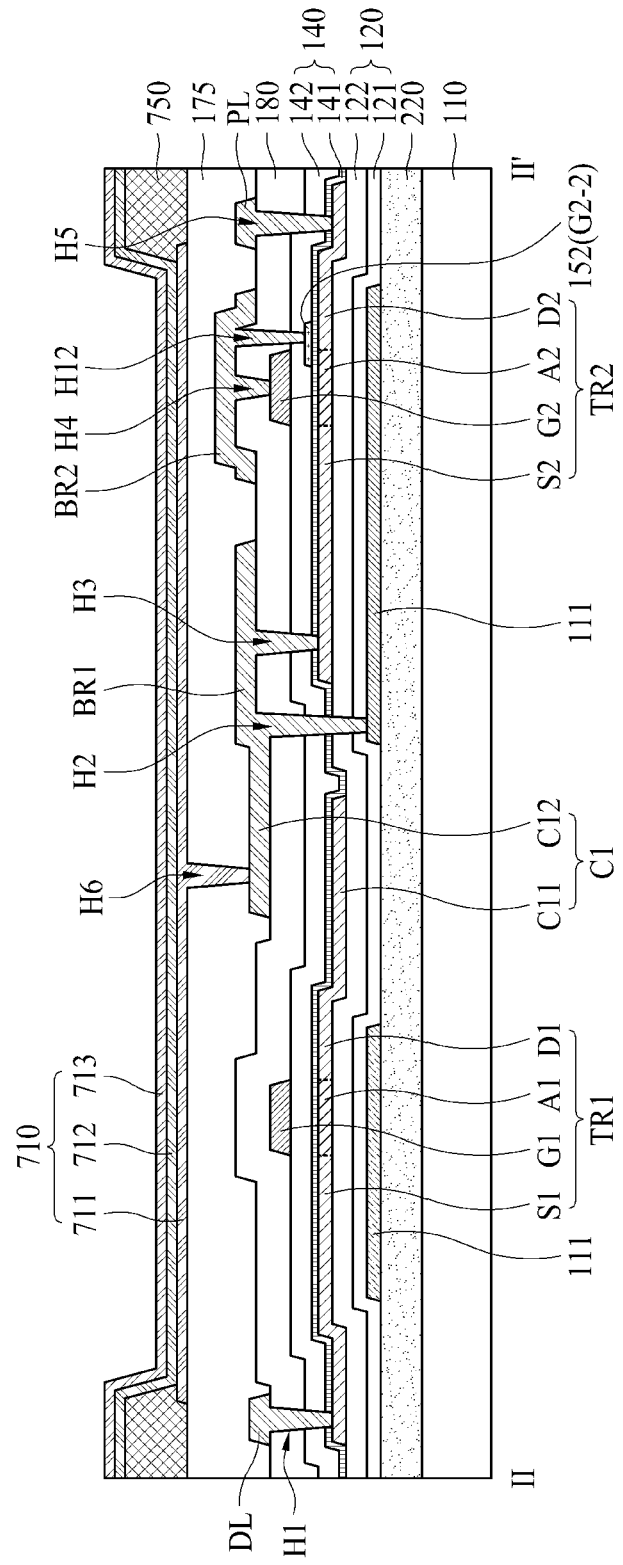
FIG. 16 is a cross-sectional view taken along line II-II' of FIG. 15 13 according to one embodiment of the present disclosure.

FIG. 15 is a circuit diagram illustrating any one pixel P of a display device 800 according to still another embodiment of the present disclosure. FIG. 16 is a cross-sectional view taken along line II-II' of FIG. 15 according to still another embodiment of the present disclosure.

The display device 800 shown in FIGS. 15 and 16 does not include the first conductive material layer 171, and further includes a second gate electrode 152 (G2-2) in comparison with the display device 700 shown in FIGS. 13 and 14.

The gate insulating layer 140 of the display device 800 shown in FIGS. 15 and 16 includes a first gate insulating layer 141 and a second gate insulating layer 142.

In the second thin film transistor TR2, the second gate electrode 152 (G2-2) is disposed on the first gate insulating layer 141, the second gate insulating layer 142 is disposed on the second gate electrode 152 (G2-2), and the gate electrode G2 of the second thin film transistor TR2 is disposed on the second gate insulating layer 142.

The second gate electrode 152 (G2-2) may be connected to the gate electrode G2 of the second thin film transistor TR2 by the second bridge BR2. In detail, the second bridge BR2 is connected to the gate electrode G2 of the second thin film transistor TR2 through a fourth contact hole H4, is connected to the second gate electrode 152 (G2-2) through a twelfth contact hole H12, and is connected to the first capacitor electrode C11 of the first capacitor C1 through a seventh contact hole H7.

Figure 17:
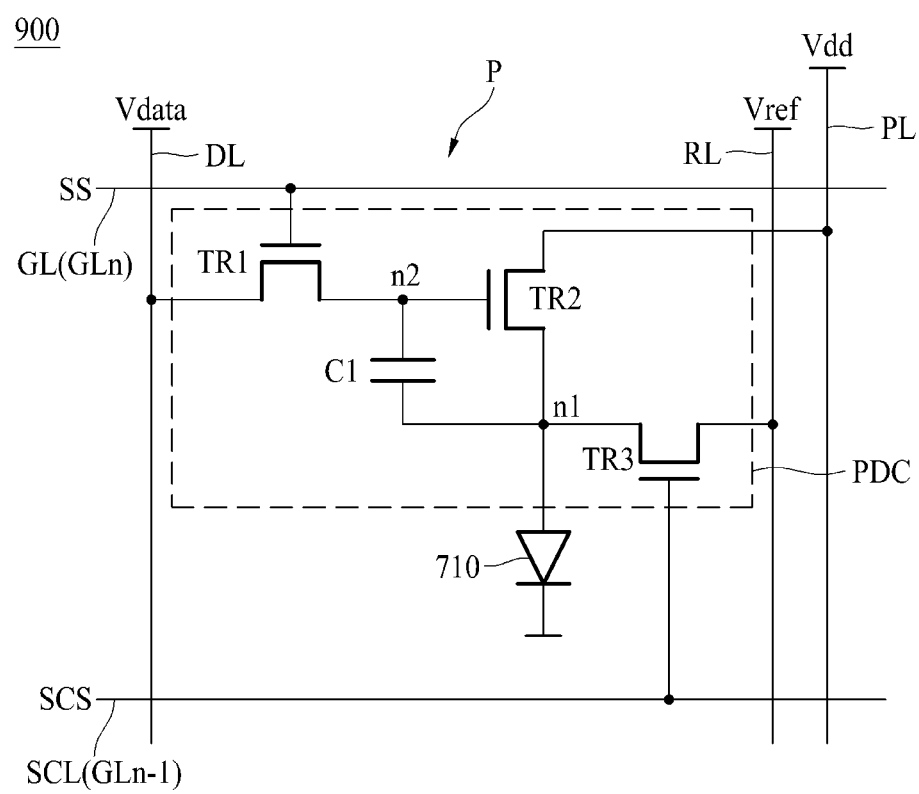
FIG. 17 is a circuit diagram illustrating any one pixel of a display device according to another embodiment of the present disclosure.

FIG. 17 is a circuit diagram illustrating any one pixel P of a display device 900 according to further still another embodiment of the present disclosure.

FIG. 17 is an equivalent circuit diagram illustrating a pixel P of an organic light emitting display device.

The pixel P of the display device 900 shown in FIG. 17 includes an organic light emitting diode (OLED) that is a display element 710 and a pixel driving circuit PDC for driving the display element 710. The display element 710 is connected with the pixel driving circuit PDC.

In the pixel P, signal lines DL, GL, PL, RL and SCL for supplying a signal to the pixel driving circuit PDC are disposed.

The data voltage Vdata is supplied to the data line DL, the scan signal SS is supplied to the gate line GL, the driving voltage Vdd for driving the pixel is supplied to the driving power line PL, a reference voltage Vref is supplied to a reference line RL, and a sensing control signal SCS is supplied to a sensing control line SCL.

Referring to FIG. 17, assuming that a gate line of an (n)th pixel P is "$GL_n$", a gate line of a (n−1)th pixel P adjacent to the (n)th pixel P is "$GL_{n-1}$" and the gate line "$GL_{n-1}$" of the (n−1)th pixel P serves as a sensing control line SCL of the (n)th pixel P.

The pixel driving circuit PDC includes, for example, a first thin film transistor TR1 (switching transistor) connected with the gate line GL and the data line DL, a second thin film transistor TR2 (driving transistor) for controlling a magnitude of a current output to the display element 710 in accordance with the data voltage Vdata transmitted through the first thin film transistor TR1 and a third thin film transistor TR3 (reference transistor) for sensing characteristics of the second thin film transistor TR2.

A first capacitor C1 is positioned between the gate electrode G2 of the second thin film transistor TR2 and the display element 710. The first capacitor C1 is referred to as a storage capacitor Cst.

The first thin film transistor TR1 is turned on by the scan signal SS supplied to the gate line GL to transmit the data voltage Vdata, which is supplied to the data line DL, to the gate electrode G2 of the second thin film transistor TR2.

The third thin film transistor TR3 is connected to a first node n1 between the second thin film transistor TR2 and the display element 710 and the reference line RL and thus is turned on or off by the sensing control signal SCS, and senses characteristics of the second thin film transistor TR2, which is a driving transistor, for a sensing period.

A second node n2 connected with the gate electrode G2 of the second thin film transistor TR2 is connected with the first thin film transistor TR1. The first capacitor C1 is formed between the second node n2 and the first node n1.

When the first thin film transistor TR1 is turned on, the data voltage Vdata supplied through the data line DL is supplied to the gate electrode G2 of the second thin film transistor TR2. The data voltage Vdata is charged in the first capacitor C1 formed between the gate electrode G2 and the source electrode S2 of the second thin film transistor TR2.

When the second thin film transistor TR2 is turned on, the current is supplied to the display element 710 through the second thin film transistor TR2 in accordance with the driving voltage Vdd for driving the pixel, whereby light is output from the display element 710.

Figure 18:
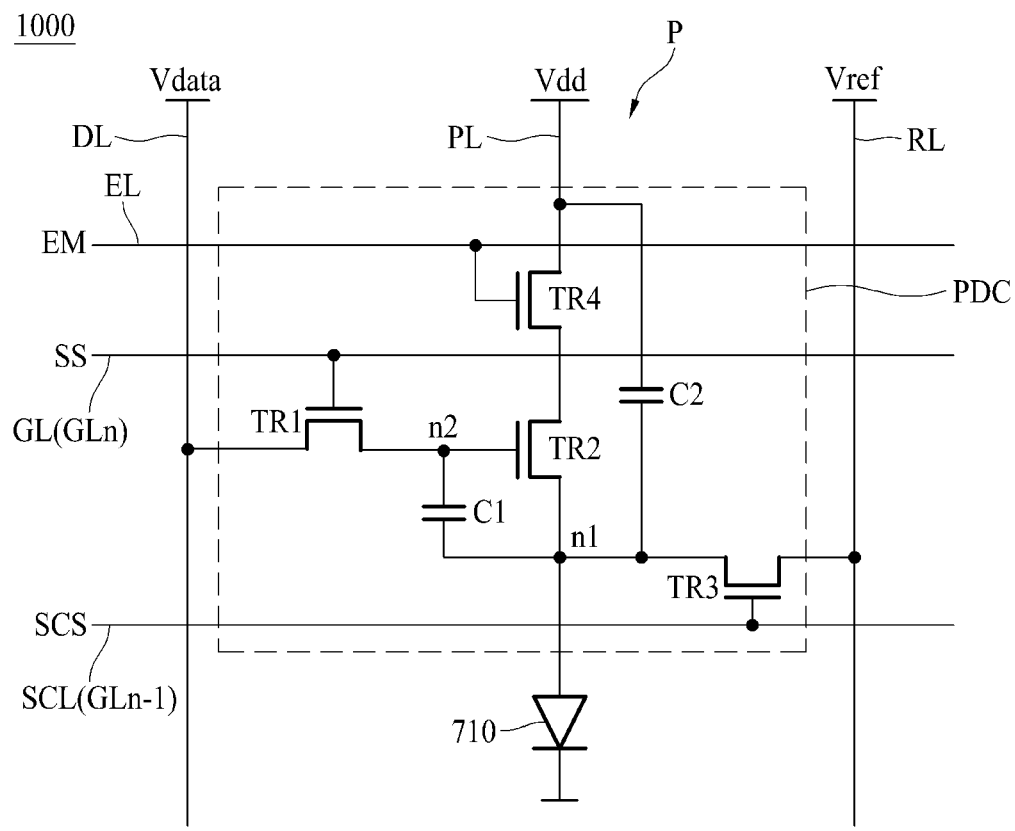
FIG. 18 is a circuit diagram illustrating any one pixel of a display device according to another embodiment of the present disclosure.

FIG. 18 is a circuit diagram illustrating a pixel of a display device 1000 according to further still another embodiment of the present disclosure.

The pixel P of the display device 1000 shown in FIG. 18 includes an organic light emitting diode (OLED) that is a display element 710 and a pixel driving circuit PDC for driving the display element 710. The display element 710 is connected with the pixel driving circuit PDC.

The pixel driving circuit PDC includes thin film transistors TR1, TR2, TR3 and TR4.

In the pixel P, signal lines DL, EL, GL, PL, SCL and RL for supplying a driving signal to the pixel driving circuit PDC are disposed.

In comparison with the pixel P of FIG. 17, the pixel P of FIG. 18 further includes an emission control line EL. An emission control signal EM is supplied to the emission control line EL.

Also, the pixel driving circuit PDC of FIG. 18 further includes a fourth thin film transistor TR4 that is an emission control transistor for controlling a light emission timing of the second thin film transistor TR2, in comparison with the pixel driving circuit PDC of FIG. 17.

Referring to FIG. 18, assuming that a gate line of an (n)th pixel P is "$GL_n$", a gate line of a (n−1)th pixel P adjacent to the (n)th pixel P is "$GL_{n-1}$" and the gate line "$GL_{n-1}$" of the (n−1)th pixel P serves as a sensing control line SCL of the (n)th pixel P.

A first capacitor C1 is positioned between the gate electrode G2 of the second thin film transistor TR2 and the display element 710. A second capacitor C2 is positioned between one of terminals of the fourth thin film transistor TR4, to which a driving voltage Vdd is supplied, and one electrode of the display element 710.

The first thin film transistor TR1 is turned on by the scan signal SS supplied to the gate line GL to transmit the data voltage Vdata, which is supplied to the data line DL, to the gate electrode G2 of the second thin film transistor TR2.

The third thin film transistor TR3 is connected to the reference line RL and thus is turned on or off by the sensing control signal SCS, and senses characteristics of the second thin film transistor TR2, which is a driving transistor, for a sensing period.

The fourth thin film transistor TR4 transfers the driving voltage Vdd to the second thin film transistor TR2 in accordance with the emission control signal EM or shields the driving voltage Vdd. When the fourth thin film transistor TR4 is turned on, a current is supplied to the second thin film transistor TR2, whereby light is output from the display element 710.

The pixel driving circuit PDC according to further still another embodiment of the present disclosure may be formed in various structures in addition to the above-described structure. The pixel driving circuit PDC may include, for example, five or more thin film transistors.

According to the present disclosure, the following advantageous effects may be obtained.

The thin film transistor according to one embodiment of the present disclosure has a large s-factor and at the same time has large ON-current characteristics in an ON-state. Therefore, when this thin film transistor is used, a gray scale representation capability of the display device may be improved, and current characteristics may be also improved.

It will be apparent to those skilled in the art that the present disclosure described above is not limited by the above-described embodiments and the accompanying drawings and that various substitutions, modifications and variations can be made in the present disclosure without departing from the scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A thin film transistor comprising:
    an active layer on a substrate, the active layer including:
        a channel portion;
        a first connection portion that is in contact with a first side of the channel portion; and
        a second connection portion that is in contact with a second side of the channel portion,
        wherein a first area of the channel portion is in contact with the first connection portion, and a second area of the channel portion is in contact with the second connection portion,
    a first gate electrode at least partially overlapping the active layer;
    a conductive material layer between the substrate and the active layer, the conductive material layer overlapping the second area of the channel portion without overlapping the first area of the channel portion, and the conductive material layer is connected to the second connection portion, and
    a second gate electrode between the first gate electrode and the active layer, the second gate electrode overlapping the first area of the channel portion, and
    wherein the second gate electrode is non-overlapping with the second area of the channel portion.

2. The thin film transistor of claim 1, wherein the conductive material layer comprises a material having light shielding characteristics.

3. The thin film transistor of claim 1, further comprising:
    a second gate electrode between the first gate electrode and the active layer, the second gate electrode overlapping the first area of the channel portion and non-overlapping with the second area of the channel portion.

4. The thin film transistor of claim 1, wherein at least a portion of the second gate electrode overlaps the first gate electrode, and at least a portion of the second gate electrode is non-overlapping with the first gate electrode.

5. The thin film transistor of claim 1, wherein a same voltage is applied to the first gate electrode and the second gate electrode.

6. The thin film transistor of claim 1, wherein an effective gate voltage applied to a first area of the channel portion is greater than an effective gate voltage applied to a second area of the channel portion.

7. A display device comprising the thin film transistor of claim 1.

8. The thin film transistor of claim 1, wherein the active layer includes an oxide semiconductor material.

9. The thin film transistor of claim 8, wherein the oxide semiconductor material includes at least one of an IZO (InZnO)-based, IGO (InGaO)-based, ITO (InSnO)-based, IGZO (InGaZnO)-based, IGZTO (InGaZnSnO)-based, GZTO (GaZnSnO)-based, GZO (GaZnO)-based, ITZO (InSnZnO)-based or FIZO(FeInZnO)-based oxide semiconductor material.

10. The thin film transistor of claim 1, wherein the active layer includes:
    a first oxide semiconductor layer; and
    a second oxide semiconductor layer on the first oxide semiconductor layer.

11. The thin film transistor of claim 10, wherein the active layer further includes a third oxide semiconductor layer on the second oxide semiconductor layer.

* * * * *